(12) United States Patent
Tanaka et al.

(10) Patent No.: US 7,623,896 B2
(45) Date of Patent: Nov. 24, 2009

(54) WIRELESS COMMUNICATION CIRCUIT AND WIRELESS COMMUNICATION APPARATUS USING THE SAME

(75) Inventors: Toshiyuki Tanaka, Yamatokoriyama (JP); Shinji Hara, Nara (JP); Kazuya Oyama, Ikoma (JP); Manabu Omori, Sakai (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 314 days.

(21) Appl. No.: 10/945,955

(22) Filed: Sep. 22, 2004

(65) Prior Publication Data
US 2005/0170788 A1 Aug. 4, 2005

Related U.S. Application Data

(60) Provisional application No. 60/607,349, filed on Sep. 7, 2004.

(30) Foreign Application Priority Data
Feb. 4, 2004 (JP) ............................... 2004-028696

(51) Int. Cl.
H04B 1/38 (2006.01)
(52) U.S. Cl. .................... 455/572; 455/73; 455/522; 455/127.1; 455/127.2; 455/574; 455/136; 455/138; 330/297; 318/254; 318/138
(58) Field of Classification Search ................. 455/522, 455/127.1, 127.2, 572, 574, 136, 138; 330/297; 318/254, 138
See application file for complete search history.

(56) References Cited

U.S. PATENT DOCUMENTS

| | | | | |
|---|---|---|---|---|
| 4,710,684 A | * | 12/1987 | Okita et al. | 318/400.27 |
| 4,831,334 A | * | 5/1989 | Hudspeth et al. | 330/10 |
| 5,179,353 A | * | 1/1993 | Miyake | 330/129 |
| 5,408,691 A | * | 4/1995 | Takao | 455/127.1 |
| 5,574,991 A | * | 11/1996 | Miyama et al. | 455/126 |
| 5,613,229 A | * | 3/1997 | Baranowski et al. | 455/127.1 |
| 6,166,598 A | * | 12/2000 | Schlueter | 330/127 |
| 6,215,987 B1 | * | 4/2001 | Fujita | 455/127.3 |
| 6,256,482 B1 | * | 7/2001 | Raab | 455/108 |
| 6,335,641 B1 | * | 1/2002 | Tougou | 327/73 |
| 6,374,127 B1 | * | 4/2002 | Park | 455/572 |
| 6,400,228 B1 | * | 6/2002 | Verbist et al. | 330/297 |

(Continued)

FOREIGN PATENT DOCUMENTS

EP 1032120 A2 * 8/2000

(Continued)

*Primary Examiner*—Matthew D Anderson
*Assistant Examiner*—April S Guzman
(74) *Attorney, Agent, or Firm*—Birch, Stewart, Kolasch and Birch, LLP

(57) ABSTRACT

When power to be transmitted varies, a control section instructs an AGC control section to control a gain of an IQ modulation processing section 6 in accordance with the power. A switch selects a power source voltage, corresponding to the power to be transmitted, from power source voltages V1 to V3 of a wireless module, in accordance with an instruction of the control section, so as to supply thus selected power source voltage to a power amplifier. Thus, it is possible to realize a wireless communication circuit which occupies a less area and consumes smaller amounts of power without narrowing a communication range.

12 Claims, 13 Drawing Sheets

U.S. PATENT DOCUMENTS

| | | | |
|---|---|---|---|
| 6,532,357 B1* | 3/2003 | Ichikawa | 455/126 |
| 6,621,350 B2* | 9/2003 | Verbist et al. | 330/297 |
| 6,760,604 B2* | 7/2004 | Leizerovich | 455/574 |
| 6,781,452 B2* | 8/2004 | Cioffi et al. | 330/10 |
| 7,038,333 B2* | 5/2006 | Bourilkov et al. | 307/46 |
| 7,046,974 B2* | 5/2006 | Yamaguchi | 455/127.1 |
| 7,068,985 B2* | 6/2006 | Quilisch et al. | 455/127.2 |
| 7,116,946 B2* | 10/2006 | Tanabe et al. | 455/91 |
| 7,116,947 B2* | 10/2006 | Tanabe et al. | 455/91 |
| 7,239,046 B2* | 7/2007 | Kudo et al. | 307/82 |
| 2003/0083036 A1* | 5/2003 | Liu | 455/343 |
| 2004/0072597 A1* | 4/2004 | Epperson et al. | 455/572 |
| 2005/0064827 A1* | 3/2005 | Schumacher et al. | 455/115.1 |
| 2005/0170788 A1* | 8/2005 | Tanaka et al. | 455/73 |
| 2006/0246857 A1* | 11/2006 | Grillo et al. | 455/127.1 |
| 2007/0015475 A1* | 1/2007 | Schoofs et al. | 455/127.1 |

FOREIGN PATENT DOCUMENTS

| | | |
|---|---|---|
| JP | 4-116440 U | 10/1992 |
| JP | 9-83404 A | 3/1997 |
| JP | 10-215212 A | 8/1998 |
| JP | 11-266546 A | 9/1999 |
| JP | 11-298342 A | 10/1999 |
| JP | 3093705 B2 | 7/2000 |
| JP | 2002-290247 A | 10/2002 |
| JP | 2003-229729 A | 8/2003 |

* cited by examiner

FIG. 5

| OUTPUT OF POWER AMPLIFIER[dBm] | CURRENT CONSUMPTION WITH RESPECT TO EACH POWER SOURCE VOLTAGE[mA] | | | |
|---|---|---|---|---|
| | 3.3[V] | 3.0[V] | 2.0[V] | 1.0[V] |
| 20 | 90 | 89 | — | — |
| 19 | 81 | 80 | — | — |
| 18 | 74 | 73 | 71 | — |
| 17 | 68 | 67 | 65 | — |
| 16 | 63 | 62 | 60 | — |
| 15 | 59 | 58 | 56 | — |
| 14 | 55 | 54 | 52 | — |
| 13 | 52 | 51 | 49 | — |
| 12 | 49 | 48 | 46 | — |
| 11 | 46 | 45 | 43 | — |
| 10 | 44 | 43 | 41 | — |
| 9 | 42 | 41 | 39 | 38 |
| 8 | 40 | 39 | 37 | 36 |
| 7 | 39 | 38 | 36 | 35 |
| 6 | 38 | 37 | 35 | 34 |
| 5 | 37 | 36 | 34 | 33 |
| 4 | 36 | 35 | 33 | 32 |
| 3 | 36 | 35 | 33 | 32 |
| 2 | 35 | 34 | 32 | 31 |
| 1 | 35 | 34 | 32 | 31 |
| 0 | 35 | 34 | 32 | 31 |
| -1 | 34 | 33 | 31 | 30 |
| -2 | 34 | 33 | 31 | 30 |
| -3 | 34 | 33 | 31 | 30 |
| -4 | 34 | 33 | 31 | 30 |
| -5 | 34 | 33 | 31 | 30 |
| -6 | 34 | 33 | 31 | 30 |
| -7 | 33 | 32 | 30 | 29 |
| -8 | 33 | 32 | 30 | 29 |
| -9 | 33 | 32 | 30 | 29 |
| -10 | 33 | 32 | 30 | 29 |
| -11 | 33 | 32 | 30 | 29 |
| -12 | 33 | 32 | 30 | 29 |

FIG. 6

| POWER SUPPLY VOLTAGE | MAXIMUM OUTPUT |
|---|---|
| 3.0[V] | 20[dBm] |
| 2.5[V] | 18[dBm] |
| 2.0[V] | 16[dBm] |
| 1.5[V] | 13[dBm] |
| 1.0[V] | 9[dBm] |
| 0[V] | -10[dBm] |

FIG. 7

| OUTPUT [dBm] | EMBODIMENT OF PRESENT INVENTION (WHERE POWER SOURCE VOLTAGE IS VARIABLE) | | | | | COMPARATIVE EXAMPLE (WHERE POWER SOURCE VOLTAGE IS FIXED) | | | | |
|---|---|---|---|---|---|---|---|---|---|---|
| | POWER SOURCE VOLTAGE [V] | CURRENT CONSUMPTION [mA] | CONTROL POWER [mW] | POWER CONSUMPTION [mW] | POWER CONSUMPTION RELATIVE VALUE | POWER SOURCE VOLTAGE [V] | CURRENT CONSUMPTION [mA] | CONTROL POWER [mW] | POWER CONSUMPTION [mW] | POWER CONSUMPTION RELATIVE VALUE |
| 20 | 3.0 | 89.0 | 10.0 | 277.0 | 100.0% | 3.0 | 89.0 | 10.0 | 277.0 | 100.0% |
| 18 | 2.5 | 72.0 | 10.0 | 190.0 | 68.6% | 3.0 | 73.0 | 10.0 | 229.0 | 82.7% |
| 16 | 2.0 | 60.0 | 10.0 | 130.0 | 46.9% | 3.0 | 52.0 | 10.0 | 166.0 | 59.9% |
| 13 | 1.5 | 48.5 | 10.0 | 82.8 | 29.9% | 3.0 | 51.0 | 10.0 | 163.0 | 58.8% |
| 9 | 1.0 | 38.0 | 10.0 | 48.0 | 17.3% | 3.0 | 41.0 | 10.0 | 133.0 | 48.0% |
| -20 | 0.0 | 0.0 | 10.0 | 10.0 | 3.6% | 3.0 | 27.0 | 10.0 | 91.0 | 32.9% |
| -20 | 0.0 | 0.0 | 10.0 | 0.0 | 0.0% | 3.0 | 27.0 | 10.0 | 91.0 | 32.9% |

WIRELESS COMMUNICATION CIRCUIT AND WIRELESS COMMUNICATION APPARATUS USING THE SAME

This Nonprovisional application claims the benefit of U.S. Provisional Application No. 60/607,349 filed on Sep. 7, 2004, and claims priority under 35 U.S.C. § 119(a) on Patent Application No. 2004/028696 filed in Japan on Feb. 4, 2004, the entire contents of which are hereby incorporated by reference.

FIELD OF THE INVENTION

The present invention relates to various wireless communication circuits including a card type wireless communication apparatus which is connected to (i) a mobile device such as a personal computer, PDA (Personal Digital Assistant), or a mobile phone, (ii) an information terminal device such as an ADSL (Asymmetric Digital Scriber Line) modem, a wireless access-point, or a wireless router, or (iii) household audio visual equipment such as a TV or DVD player, for example, and which has a wireless communication function based on wireless communication technology in compliance with the IEEE802.11 standards or spread spectrum technology such as Bluetooth (Registered Trademark), for example. The present invention also relates to a wireless communication apparatus including the wireless communication circuit.

BACKGROUND OF THE INVENTION

First, spread spectrum wireless communications will be described. In typical communications using the spread spectrum technology, a transmitting end performs spectrum spreading using a spread code on a modulation signal which is obtained by modulating an input baseband signal such as sound, and sends the resultant spread spectrum signal as a high frequency signal (RF signal) to a receiving end. The receiving end demodulates (despreads) the spread spectrum signal sent from the transmitting end using the same spread code as that used in the transmitting end.

Further, the communication method using the spread spectrum technology includes direct sequence spread spectrum (DSSS) and frequency hoping spread spectrum. The DSSS multiplies a narrow-band modulated signal by a spread code to spread the signal evenly over a certain continuous band of frequencies. On the other hand, the frequency hopping spread spectrum randomly changes a carrier frequency using a spread code to spread the signal over a band of frequencies. Bluetooth is an exemplary application of the frequency hopping spread spectrum.

The following will explain a conventional card type wireless communication apparatus. FIG. 12 is a block circuit diagram showing schematic configuration of the conventional card type wireless communication apparatus. The conventional card type wireless communication apparatus 100 shown in FIG. 12 is so configured that an antenna 101 is connected to a receiver circuit section 102, and to a transmitter circuit section 107.

The receiver circuit section 102 is composed of an amplifier 103, a mixer circuit 104, and a demodulator circuit 105. The antenna 101 is connected to a baseband signal processing circuit section 111 through the amplifier 103, the mixer circuit 104, and the demodulator circuit 105.

The transmitter circuit 107 is composed of a modulator circuit 110, a mixer circuit 109, and an amplifier 108. The baseband signal processing circuit section 111 is connected to the antenna 101 through the modulator circuit 110, the mixer circuit 109, and the amplifier 108. The mixer circuit 104 and the mixer circuit 109 are connected to a local oscillator 106.

Further, the baseband signal processing circuit section 111 is connected to a connector 115 through an interface circuit section 112. The receiver circuit section 102, the transmitter circuit section 107, and the baseband signal processing circuit section 111 are connected to a circuit control section 113. A power source section 114 is connected to the connector 115 and to each of the above-described circuits in the card type wireless communication apparatus 100.

Next, the operation of the conventional card type wireless communication apparatus 100 shown in FIG. 12 will be described. A spread spectrum signal (e.g. 2.4 GHz band) from the transmitting end is received by the antenna 101 of the receiving end. Then, the spread spectrum signal is amplified by the amplifier 103, and is applied to the mixer circuit 104. The received high frequency signal (the spread spectrum signal) is demodulated to a baseband signal by the mixer circuit 104 and demodulator circuit 105. The baseband signal is subjected to necessary signal processing conducted by the baseband signal processing circuit section 111, and is then outputted through the interface circuit section 112 to an information terminal device such as a personal computer (not shown).

At the transmitting end, a data input signal supplied from the information terminal device such as a personal computer (not shown) through the connector 115 and interface circuit section 112 is subjected to necessary signal processing conducted by the baseband signal processing circuit section 111, and is spread to a spread spectrum signal (e.g. 2.4 GHz band) by the modulator circuit 110 and mixer circuit 109. The data signal is then amplified by the amplifier 108, and is transmitted via the antenna 101 to the receiving end.

The circuit control section 113 controls the operation of the receiver circuit section 102, the transmitter circuit section 107, and the baseband signal processing circuit section 111. The power source section 114 receives power through the connector 115 from the information terminal device such as a personal computer (not shown), and supplies power +B to each circuit described above in the card type wireless communication apparatus 100.

The local oscillator 106 generates necessary frequency signals (e.g. 2.4 GHz band) for the operation of each of the mixer circuits 104 and 109.

For controlling RF signals of a wireless section, various types of communication apparatuses modulate and demodulate signals of different frequencies and levels by converting the frequencies of the signals, and therefore require stable modulation and demodulation characteristics.

Here, one of the most important factors is an input dynamic range. The input dynamic range indicates a range of input signals from the weakest to the strongest that can be stably received and demodulated.

For a wireless communication apparatus having receiver and transmitter circuits, the dynamic range is determined mainly by parameters such as transmission (high frequency) power, receiving sensitivity, and a distortion property.

For a short distance communication in which a distance between a host (master) (access point, a router, a transmission box, etc.) and a client (slave) is short, one of conventional arts for attaining a larger communication range is to prevent deterioration in distortion property with respect to a strong input signal by using an attenuator in an input stage of a receiver, or by lowering a gain of a low noise amplifier or an IF amplifier (see Japanese Publication of Utility Model, Jitsukaihei, No. 4-116440; published on Oct. 29, 1992).

FIG. 13 shows an example of the conventional art. In FIG. 13, an attenuator circuit (RF ATT) 140 is provided in between an input terminal 121 for a high frequency input signal and a high frequency amplifier 128. The attenuator circuit 140 is composed of a high frequency amplifier 141, an attenuator 142, a switch 143 that selectively connects the high frequency amplifier 141 or the attenuator 142 to the input terminal 121, and a switch 144 that selectively connects the high frequency amplifier 141 or the attenuator 142 to the high frequency amplifier 128.

Note that, in FIG. 13, there are provided a high frequency bandpass filter (RFBPF) 129, a mixer (MIXER) 130, a first voltage controlling oscillator (VCD1) 131, a first IF amplifier (IFAMP) 132, an IF bandpass filter 133, a second IF amplifier 134, an FM detector (FMDET) 135, a second voltage controlling oscillator 136, and an output terminal 137 for outputting a detected signal. These circuits are conventionally well known, thus their explanation is omitted here.

Incidentally, a mobile wireless communication apparatus is particularly required to reduce its power consumption in order to operate for a longer time. Here, a circuit similar to the attenuator circuit (RF ATT) 140 may be provided as a power amplifier for amplifying transmission power, so that the size of the transmission power is changed according to conditions. With this arrangement, by reducing the transmission power when the transmission power is not required much, it is possible to reduce the power consumption without narrowing the communication range.

However, in the arrangement in which the power source voltage of the power amplifier is fixed, it is difficult to sufficiently reduce the power consumed by the power amplifier. Accordingly, further reduction of the power consumption is demanded. Note that, the reduction of power consumption and occupying area is especially required for a mobile wireless communication apparatus, but also preferably required for a stationary apparatus.

SUMMARY OF THE INVENTION

The present invention has an objective to realize a wireless communication circuit that occupies a small area and consumes small amounts of power without narrowing the communication range; and a wireless communication apparatus using the same.

In order to achieve the foregoing objective, the wireless communication circuit according to the present invention, provided with an amplifier for amplifying an inputted signal so as to output thus amplified signal to an antenna, includes: a switch for selecting a constant voltage from predetermined plural constant voltages supplied to at least one of circuits, other than the amplifier, either contained in the wireless communication circuit or electrically connected to the wireless communication circuit, so as to supply thus selected constant voltage; and control means for switching the switch in accordance with a power which should be outputted by the amplifier.

Note that, any circuit is used as the circuit other than the amplifier as long as the circuit is included in the wireless communication circuit or is electrically connected to the wireless communication circuit (for example, the circuit is included in the wireless communication apparatus having the wireless communication circuit). An example of the circuit other than the amplifier is a circuit (signal source) used to generate a signal supplied to the amplifier. Examples of the circuit used to generate a signal supplied to the amplifier include: a data processing circuit for generating data that should be sent; a storage device which stores data referred to by the data processing circuit in generating the data that should be sent; and a modulation circuit for modulating the data that should be sent. Further, the circuit other than the amplifier may be an interface circuit with respect to a host computer, a memory circuit that is not used to generate the signal supplied to the amplifier, or sound/video data processing circuit for example, as long as the circuit is included in the wireless communication circuit or is electrically connected to the wireless communication circuit.

In the foregoing arrangement, the control means causes the switch to select any one of the constant voltages in accordance with a power which should be outputted by the amplifier and to supply thus selected constant voltage to the amplifier, and the amplifier uses the constant voltage as a power source voltage and amplifies an inputted signal (e.g., a signal or the like from the signal source) so as to output thus amplified signal to the antenna.

As a result, it is possible to change transmission power of a radio signal outputted from the antenna. Thus, in case where it is possible to perform communications even when the transmission power is not so high, for example, in case where a communication end is positioned relatively near to the wireless communication circuit, it is possible to reduce power consumption by dropping the power source voltage of the amplifier. While, in case where it is impossible to perform communications unless the transmission power is so high, for example, in case where the communication end is positioned relatively far from the wireless communication circuit, it is possible to transmit the radio signal with necessary communication power by raising the power source voltage of the amplifier.

Generally, the power consumption of the amplifier of the wireless communication apparatus is basically as follows: power consumption×power source voltage. The communication power which can be outputted by the amplifier drops as the power source voltage drops. Thus, according to an arrangement in which the transmission power is fixed, when the power source voltage of the amplifier is set to be high for fear that it is impossible to perform communications unless the transmission power is so high, power consumed in case where great transmission power is not required is increased. While, according to an arrangement in which the transmission power is fixed, when the power source voltage is set to be suitable for the case where great transmission power is not required, it is impossible to make the transmission power so high, so that it is impossible to perform communications with a communication end positioned far from the wireless communication circuit.

On the other hand, according to the foregoing arrangement, the transmission power is changed as required, and the power source voltage of the amplifier is changed, so that it is possible to largely reduce the power consumption of the wireless communication circuit, without narrowing the communication range, compared with an arrangement in which the transmission power is uniformed and an arrangement in which the power source voltage of the amplifier is fixed.

Further, the constant voltage selected by the switch is a constant voltage supplied to the signal source, so that it is not necessary to newly provide a voltage generating circuit as long as a system having the signal source is used. This is because the voltage generating circuit exists in the system in order to operate the signal source. Thus, it is possible to reduce the circuit size and the power consumption compared with the case where the voltage generating circuit is provided.

As a result, it is possible to realize the wireless communication circuit which occupies a small area and consumes small amounts of power without narrowing the communication range.

For a fuller understanding of the nature and advantages of the invention, reference should be made to the ensuing detailed description taken in conjunction with the accompanying drawings.

BRIEF DESCRIPTION OF THE DRAWINGS

FIG. 5 is a diagram showing a relationship an output of the power amplifier and a current consumption in each power source voltage so as to show the characteristics of the power amplifier.

FIG. 6 is a diagram showing a relationship between the power source voltage and a maximum power, which can be outputted, so as to show the characteristics of the power amplifier.

FIG. 7 is a diagram showing a relationship between an output power and a power consumption in a case where the power source voltage is varied and in a case where the power source voltage is fixed.

DESCRIPTION OF THE EMBODIMENTS

Embodiment 1

One embodiment of the present invention is described as follows with reference to FIG. 1 to FIG. 8. That is, a wireless communication apparatus according to the present embodiment can change a transmission power depending on conditions, and can reduce the power consumption by switching also a power source voltage of an amplifier in changing the transmission power. For example, the wireless communication apparatus is favorably used as a wireless communication apparatus having a wireless communication function using Direct Spread Spectrum based on a spectrum spreading technology.

The following description will briefly explain an arrangement of the whole wireless communication circuit before explaining an arrangement for changing the power source voltage. Note that, the wireless communication apparatus may generate a high frequency signal in accordance with any modulation method, or may generate an intermediate frequency signal, or may generate the high frequency signal directly from a baseband signal without generating the intermediate frequency signal. The following description will explain an example where the modulation is carried out in accordance with QPSK (QuardriPhase-Shift Keying) and the intermediate frequency signal is generated.

Figure 1:
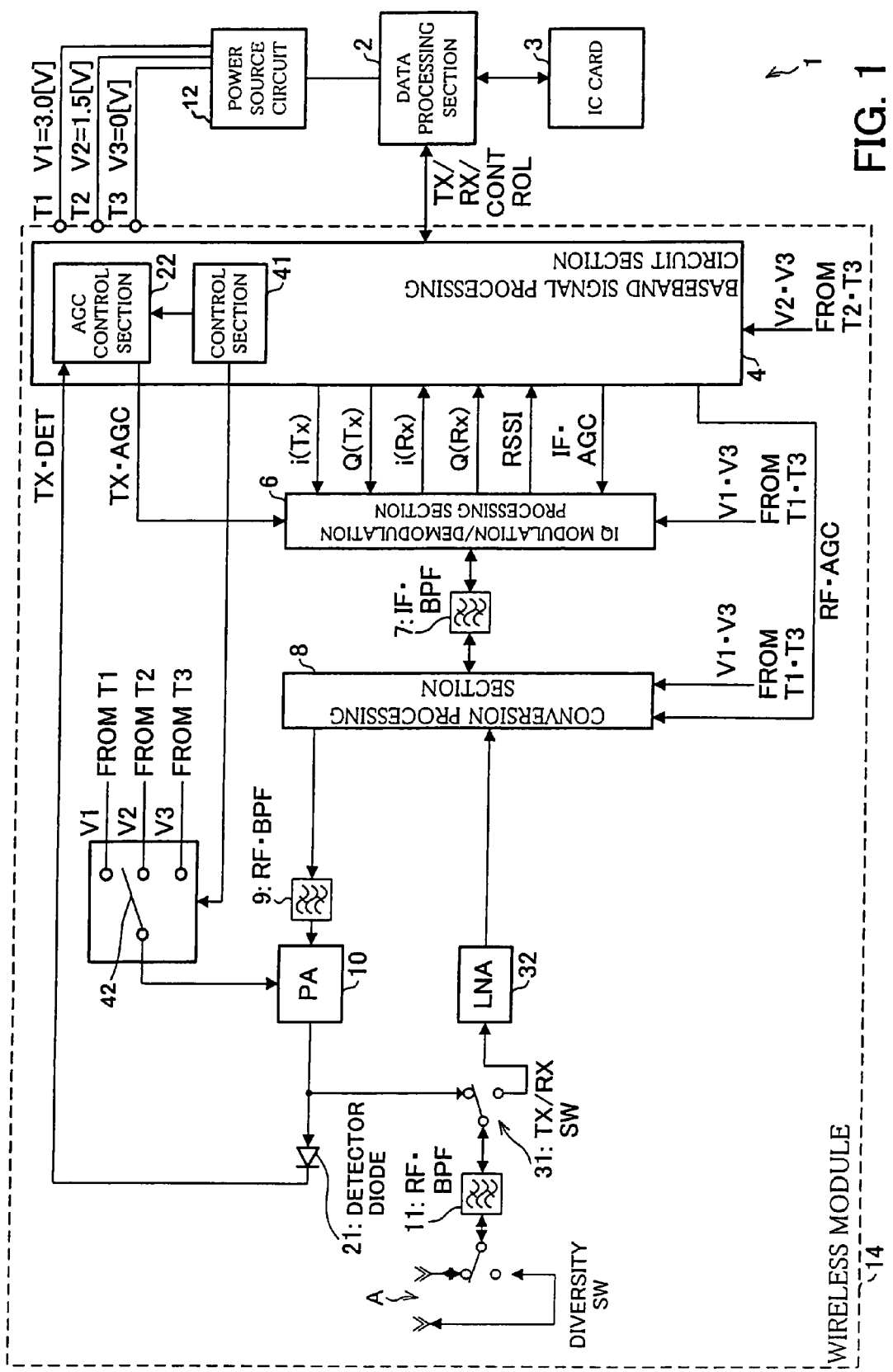
FIG. 1 is a block diagram showing an arrangement of important portions of a wireless communication apparatus as an embodiment of the present invention.

As shown in FIG. 1, a wireless communication apparatus 1 according to the present embodiment includes: a data processing section (signal source) 2 for processing data; a baseband signal processing circuit section 4 for serial/parallel converting a data signal Tx so as to generate an I signal and a Q signal, that are orthogonal to each other (quadrature), upon receiving the data signal Tx that should be sent from the data processing section 2; an IQ modulation/demodulation processing section 6 for synthesizing the I signal and the Q signal, that have been generated, in accordance with data signals i(Tx) and Q(Tx), that have been subjected to serial/parallel conversion, so as to generate an intermediate frequency signal that has been subjected to QPSK modulation; a conversion processing section 8 for converting the intermediate frequency signal into a high frequency signal; a power amplifier 10 for amplifying the high frequency signal from the conversion processing section 8 so as to output thus amplified high frequency signal to an antenna A; and a power source circuit 12 for supplying a power source voltage to internal circuits (for example, the foregoing members 2 to 10 and the like) of the wireless communication apparatus 1.

Note that, the wireless communication apparatus 1 according to the present embodiment includes: an intermediate frequency band pass filter (IF•BPF) 7 provided between the IQ modulation/demodulation processing section 6 and the conversion processing section 8; a high frequency band pass filter (RF•BPF) 9 provided between the conversion processing section 8 and the power amplifier 10; and a high frequency band pass filter (RF•BPF) 11 provided between the power amplifier 10 and the antenna A, wherein each of these band pass filters limits a frequency band of a signal flowing therein. Further, the data processing section 2 according to the present embodiment can access an IC card (signal source) 3 such as a compact flash (Registered Trademark) card, an SD (Secure Digital: Registered Trademark) memory card, and the like, and can generate the data signal Tx by referring to the IC card 3.

Figure 2:
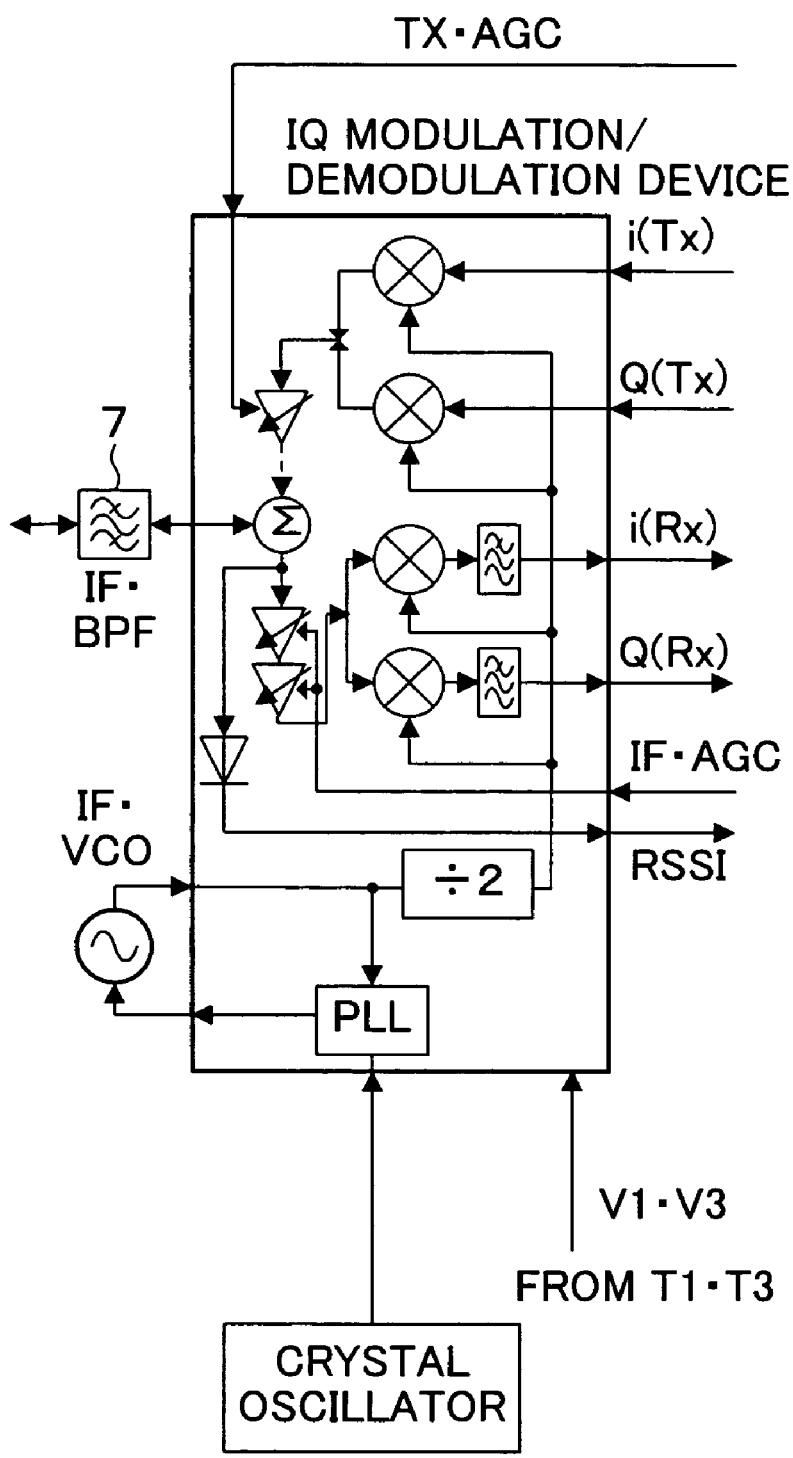
FIG. 2 is a circuit diagram showing an arrangement of important portions of an IQ modulation/demodulation processing section provided in the wireless communication apparatus.

In the IQ modulation/demodulation processing section 6, as shown in FIG. 2 for example, the data signals i(Tx) and Q(Tx) that have been subjected to the serial/parallel conversion are multiplied by intermediate frequency reference signals, orthogonal to each other, in mixers respectively corresponding to the data signals i(Tx) and Q(Tx). After thus multiplied signals are outputted as an I signal and a Q signal, these signals are synthesized. A gain-variable amplifier amplifies a signal, obtained by synthesizing the signals, in accordance with a gain indicated by an AGC control signal TX•AGC. Thereafter, the signal is outputted via the IF•BPF 7 to the conversion processing section 8 as an intermediate frequency signal. Note that, the intermediate frequency reference signal is generated by a crystal oscillator, a PLL (Phase-Locked Loop) circuit, an intermediate frequency VCO (IF•Voltage Controlled Oscillator), a divider, and the like for example, and a frequency thereof is set to be a predetermined intermediate frequency reference frequency. Further, the IQ modulation/demodulation processing section 6 is realized by an LSI of an IQ modulation/demodulation device, an IF•VCO, a crystal oscillator, and the like, that are externally provided on the LSI.

Figure 3:
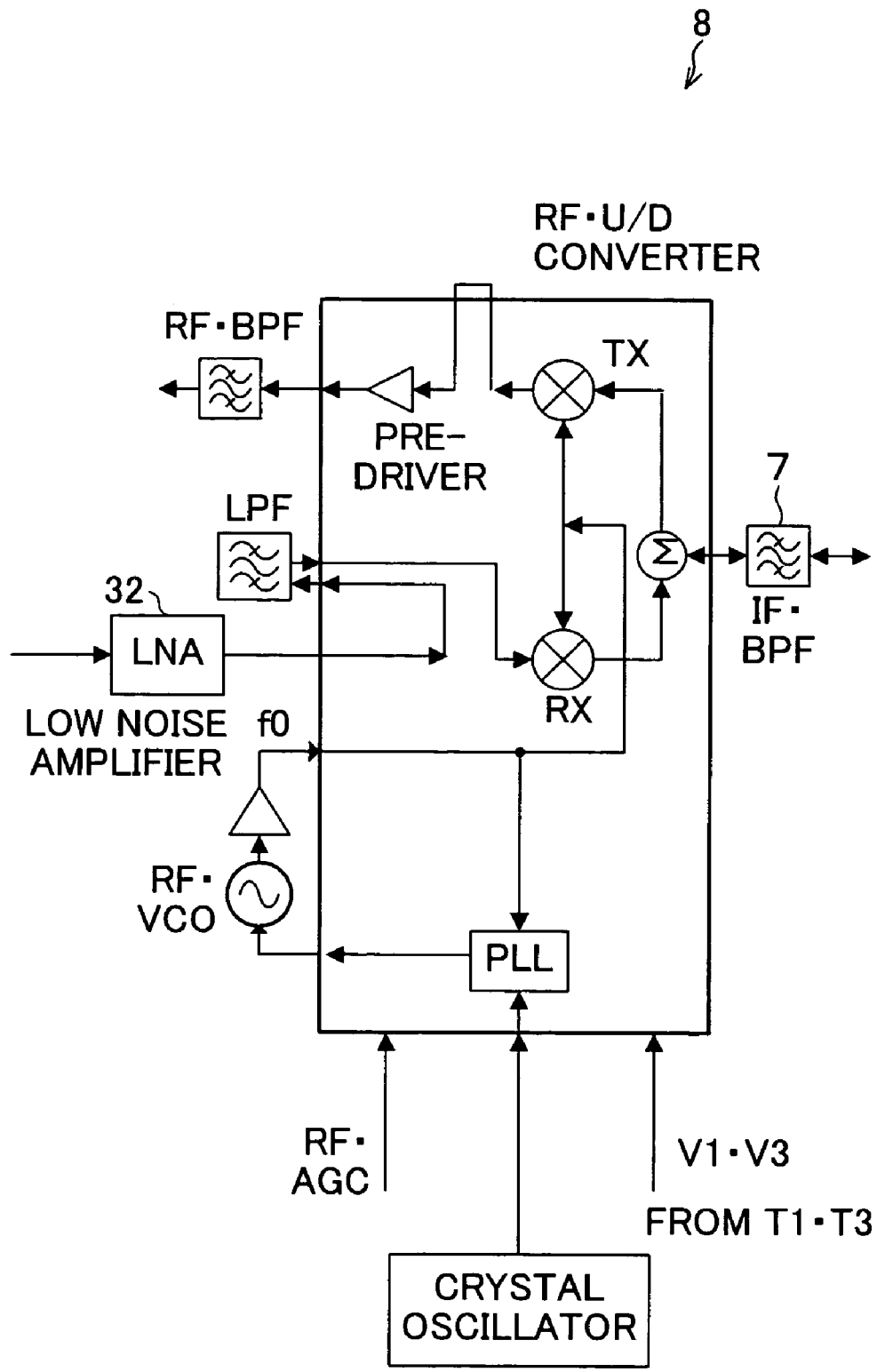
FIG. 3 is a circuit diagram showing an arrangement of important portions of a conversion processing section provided in the wireless communication apparatus.

While, in the conversion processing section 8, as shown in FIG. 3 for example, an intermediate frequency signal from the IQ modulation/demodulation processing section 6 is multiplied by a high frequency reference signal, and is up-converted into a high frequency signal. The high frequency signal is amplified by a preceding stage amplifier (PRE-DRIVER) 81. Thereafter, thus amplified signal is outputted to the power amplifier 10 via the RF•BPF 9. Note that, the high frequency reference signal is generated by a crystal oscillator, a PLL circuit, an RF•VCO, and the like for example, and a frequency thereof is set to be a predetermined high frequency reference frequency f0. Further, the conversion processing section 8 is realized by an LSI of an RF•U/D converter, an RF•VCO and a crystal oscillator that are externally provided on the LSI, and the like. Note that, in the present embodiment, the crystal oscillator is shared by the conversion processing section 8, the IQ modulation/demodulation processing section 6, and the baseband signal processing circuit section 4.

Generally, the wireless communication apparatus 1 internally has circuits different from each other in terms of a necessary power source voltage due to the following various factors: processes for producing LSIs (Large Scale Integration) are different from each other; compatibility with a past product has to be kept; control targets are different from each other. The power source circuit 12 can supply a necessary voltage to each of these circuits.

In the present state, as LSIs which can be used to constitute the wireless communication apparatus, there are LSIs which respectively require 3.3[V], 3.0[V], 1.5[V], 1.0[V], and the like as power source voltages, and it is often that there are LSIs different from each other in terms of the power source voltage in the wireless communication apparatus 1. Here, it is expected that many power source voltages of the LSIs will be lowered to 1 to 1.5[V] or less in the future. However, in case where the wireless communication apparatus 1 is a mobile device for example, it is often that a circuit (interface etc. with respect to the IC card) for accessing a detachable storage medium is required. In this case, even if advance of a process technique enables the power source voltage to drop, it is necessary to keep the power source voltage as before in order to access the storage medium that has been storing data. Thus, unlike a circuit having no interface to an outside of the wireless communication apparatus, it is difficult to drop the power source voltage. Thus, in case where there is provided a circuit having an interface to an outside, it is expected that the wireless communication apparatus 1 will internally have circuits each of which requires a plurality of power source voltages in a mixed manner.

Here, in the wireless communication apparatus 1 according to the present embodiment, members 4 to 10 each of which modulates the data signal Tx into a high frequency signal so as to output thus modulated signal from the antenna A are collected as a wireless module (wireless communication circuit) 14, and the power source circuit 12 supplies power source voltages via power source terminals (power source lines) T1 ... of the wireless module 14 to members (the baseband signal processing circuit section 4, the IQ modulation/demodulation processing section 6, the conversion processing section 8, the power amplifier 10, and the like) of the wireless module 14 each of which requires power.

The wireless module 14 is realized as a card type wireless communication apparatus or an externally/internally provided expansion device for example. The wireless module 14 is connected to, for example, (a) an information terminal device such as a personal computer, an ADSL modem, a wireless access-point, and a wireless router and the like; or (b) a household audio visual equipment such as a TV and DVD player, so that these information terminal devices and household audio visual equipments can perform wireless communications.

For example, the wireless module 14 exchanges a data signal Tx (or Rx described later) with the data processing section 2 in accordance with a type of interface circuit: PCM-CIA (for card bus of 16-bit or 32-bit) for a PC card, USB1.1 or USB2.0 for a USB adaptor, SDIO for a SD card, and so on. For an information terminal device in which the interface circuit is built in, a PCI bus or the like is used.

Note that, FIG. 1 shows an example where circuits whose power source voltages are respectively 3.0[V], 1.5[V], and 0[V] are provided in a mixed manner as the members 4 to 10 of the wireless module 14. In this example, the power source circuit 12 generates these power source voltages V1 to V3 and supplies the power source voltages V1 to V3 to the wireless module 14 via power source terminals T1 to T3. Here, the power source terminals T1 to T3 may be terminals in compliance with the foregoing standards, or the power source terminals T1 to T3 may be provided in addition to the terminals which are in compliance with the foregoing standards. Further, FIG. 1 shows an example where: the power source voltages V1 and V3 (3.0 [V] and 0 [V]) are supplied from the power source terminals T1 and T3 to the LSI of the IQ modulation/demodulation device and the LSI of the RF•U/D converter, and the power source voltages V2 and V3 (1.5 [V] and 0 [V]) are supplied from the power source terminals T2 and T3 to the LSI of the baseband processing circuit section 4.

Further, the wireless communication apparatus 1 according to the present embodiment includes: a detector diode 21 for detecting an output of the power amplifier 10; and an AGC control section 22 for adjusting transmission power of the antenna A to be constant by adjusting a gain of a transmission signal path, that is, a transmission path from the data processing section 2 to an output of the power amplifier 10 so that a detection output TX•DET of the detection circuit 21 has a predetermined value, in accordance with the detection output TX•DET. Thus, the wireless communication apparatus 1 can transmit a high frequency signal, generated by modulating the data signal Tx sent from the data processing section 2, whose power is constant, from the antenna A.

The detection circuit 21 according to the present embodiment is constituted of a diode such as a Schottky diode for example, and detects a transmission output signal so as to feedback a direct current component thereof to the AGC control section 22 of the baseband signal processing section 4 as the detection output TX•DET. While, the AGC control section 22 adjusts a gain of the IQ modulation/demodulation processing section 6 with an AGC control signal TX•AGC, in more detail, adjusts a gain of the gain-variable amplifier shown in FIG. 2 with an AGC control signal TX•AGC, so as to adjust a gain of a transmission signal path.

Further, the wireless communication apparatus 1 according to the present embodiment can perform not only transmission but also reception. Specifically, the wireless communication apparatus 1 includes: a switch (TX/RXSW) 31, provided between the antenna A and the power amplifier 10 (in more detail, between the RF•BPF 11 and the power amplifier 10), which switches transmission and reception; and a low noise amplifier (LNA) 32 provided between the TX/RXSW 31 and the conversion processing section 8. Further, the conversion processing section 8 down-converts a high frequency signal from the LNA 32 so as to convert the signal into an intermediate frequency signal, and the IQ modulation/demodulation processing section 6 performs IQ demodulation with respect to the intermediate frequency signal from the conversion processing section 8, so as to output data signals i(Rx) and Q(Rx) which are parallel in terms of a baseband, and the baseband signal processing circuit section 4 converts the data signals i(Rx) and Q(Rx) into serial data so as to output thus converted data as reception data RX to the data processing section 2.

In more detail, the TX/RXSW 31 transmits an output of the power amplifier 10 to the antenna A during a period in which the transmission is selected, and inputs a high frequency signal received by the antenna A to the low noise amplifier (LNA) 4 during a period in which the reception is selected. Further, as shown in FIG. 3 for example, in the conversion processing section 8, a low pass filter (LPF) or the like reduces an unnecessary signal of the reception signal, and then a mixer or the like multiplies a frequency of the reception signal by the high frequency reference frequency, so as to convert (down-convert) the reception signal into an intermediate frequency signal having an intermediate frequency, and thus converted signal is outputted. Note that, in the present embodiment, also the low pass filter is externally provided on the LSI of the RF•U/D converter.

A frequency band of the intermediate frequency signal from the conversion processing section 8 is limited by the IF•BPF 7 shown in FIG. 1, and the intermediate frequency signal is amplified by a gain-variable receiving amplifier in accordance with a gain indicated by the IF•AGC signal. Thereafter, a frequency of the intermediate frequency signal is multiplied by the intermediate frequency reference signals that are orthogonal to each other, and signals having thus multiplied frequencies are outputted as the data signal i(Rx) and Q(Rx). Note that, in the present embodiment, both the mixers output the signals respectively via band pass filters.

Further, the IQ modulation/demodulation processing section 6 according to the present embodiment generates a received signal intensity indicator (RSSI), indicative of an intensity of a received signal, in accordance with the received signal whose band has been limited by the IF•BPF 7. For example, as shown in FIG. 3, in the IQ modulation/demodulation processing section 6 according to the present embodiment, a diode performs envelope detection with respect to the received signal whose band has been limited by the IF•BPF 7, and generates a direct current voltage, and outputs the direct current voltage as the received signal intensity indicator. Note that, the baseband signal processing circuit section 4 generates the IF•AGC signal in accordance with the RSSI from the IQ modulation/demodulation processing section 6, and adjusts a gain of the gain-variable receiving amplifier so that amplitudes of the data signal i(Rx) and Q(Rx) from the IQ modulation/demodulation processing section 6 are constant.

Here, the wireless communication apparatus 1 according to the present embodiment includes a control section 41 for indicating transmission power, according to conditions, to the AGC control section 22 shown in FIG. 1. Note that, in the present embodiment, the control section 41 is provided on the baseband signal processing circuit section 4.

The control section 41 determines the transmission power in accordance with the RSSI for example. In more detail, in case where the RSSI is relatively high (in case where the received signal is intense), a communication end of the wireless communication apparatus 1 is positioned relatively near to the wireless communication apparatus 1, so that it is expected that relatively weak transmission power enables normal communications. While, in case where the RSSI is low (in case where the received signal is not intense), the communication end is positioned relatively far from the wireless communication apparatus 1, so that it is expected that normal communications cannot be performed when the transmission power is not so high.

In case where the RSSI from the IQ modulation/demodulation processing section 6 is higher than a predetermined first threshold value, the control section 41 giving an instruction to the AGC control section 22 so that the transmission power is the predetermined first value. Here, when the power source voltage is dropped as described later, a maximum power which can be outputted by the power amplifier 10 drops, so that the AGC control section 22 controls a gain of a transmission signal path, that is, a transmission path from the data processing section 2 to the power amplifier 10 (in this example, a gain of the gain-variable amplifier shown in FIG. 2) so that the power amplifier 10 is not saturated. Thus, the transmission power of the wireless communication apparatus 1 is adjusted to have the first value. While, in case where the RSSI is lower than the first value, an instruction is given to the AGC control section 22 so that the transmission power has a second value which is set to be higher than the first value, thereby setting the transmission power of the wireless communication apparatus 1 to be the second value.

In this manner, when the received signal is intense, the wireless communication apparatus 1 sets the transmission power to be less, so that it is possible to largely reduce the power consumption of the wireless communication apparatus 1 compared with the case of transmission with a constant power.

The wireless communication apparatus 1 changes the transmission power. Thus, even in case where a large number of wireless communication apparatuses simultaneously perform communications in a specific area like wireless LAN, it is possible to prevent the wireless communication apparatus 1 from occupying a communication band of other wireless communication apparatus and from intervening other apparatus. Particularly, in case where the wireless communication apparatus 1 is applied to a wireless LAN or the like that is in compliance with IEEE802.11b, a standard used is a 2.4 GHz frequency band. Because various fields such as industry, science, and medical science can freely use this 2.4 GHz frequency band, various apparatuses such as bluetooth-using devices, microwave ovens, POS terminals, and security cameras are emitting electronic waves of this frequency band. Under such circumstance, a suppression of an electric wave emittance level is etiquette, and is an important function.

Further, in the present embodiment, there is provided a switch 42 which selects any one of the power source voltages V1 and V2 which are supplied to the baseband signal processing circuit section 4, the IQ modulation/demodulation processing section 6, and the conversion processing section 8, and supplies thus selected power source voltage as a power source voltage of the power amplifier 10. The control section 41 controls switching of the switch 42 in accordance with transmission power that should be set. Note that, the control section 41 and the AGC control section 22 correspond to a modulation gain adjusting circuit recited in claims of the present invention. Further, the control section 41's instruction to switch the switch 42, or the control section 41's instruction to switch the AGC control section 22 may be given with a voltage or may be given with digital data.

Figure 4:
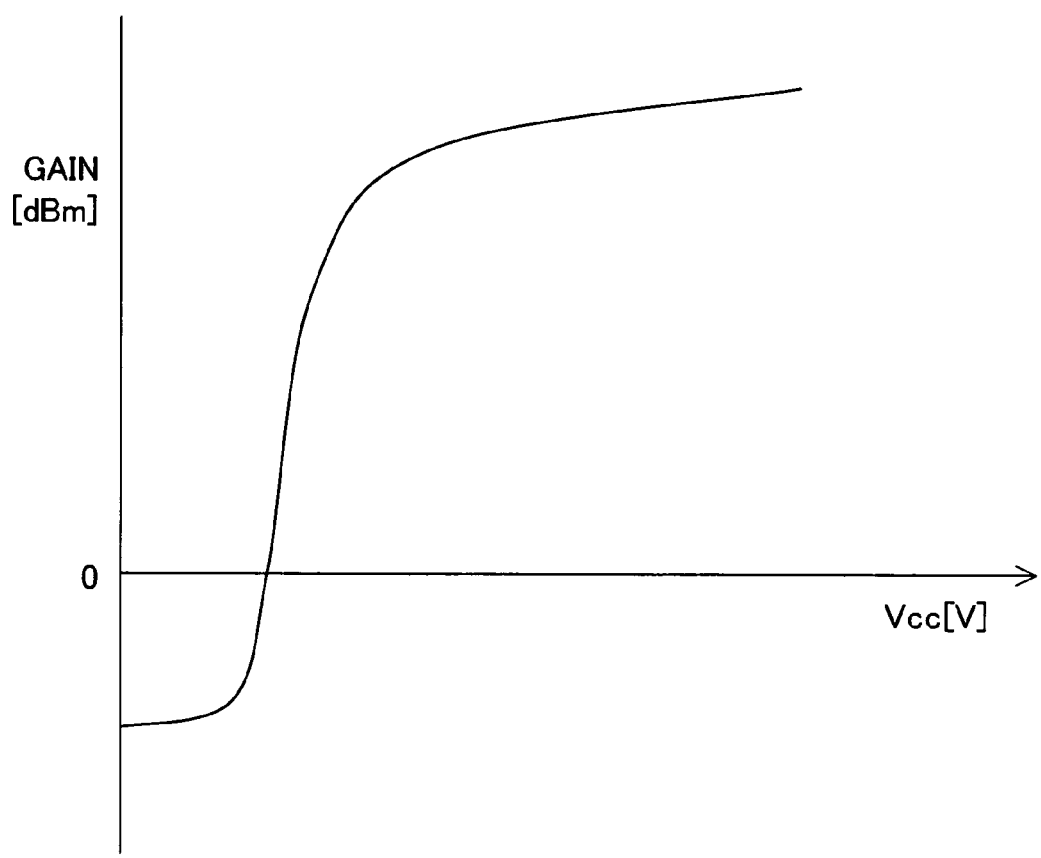
FIG. 4 is a graph showing a relationship between a power source voltage and a gain so as to show the characteristics of a power amplifier provided in the wireless communication apparatus.

Generally, a maximum output of the power amplifier 10 varies depending on a voltage as shown in FIG. 6. However, as shown in FIG. 5, within a range in which the current can be outputted, regardless of the power source voltage, the current consumption tends to be substantially constant, or to slightly decrease as the power source voltage drops. Further, as shown in FIG. 4, the power amplifier's gain with respect to the power source voltage tends to drop as the power source voltage drops. Thus, a lower voltage is selected within a voltage range in which it is possible to obtain a necessary output, and gain adjustment is performed so as to obtain a desired gain, so that it is possible to reduce the power consumption.

Further, as another arrangement (comparative example), it is possible to make such arrangement that: there are provided transmission paths, obtained by branching a transmission signal path so as to correspond to a high frequency signal and an intermediate frequency signal, which are different from each other in terms of a gain, and there is provided a switch for selecting one transmission path, via which a signal is transmitted, from the foregoing transmission paths. Unlike this arrangement, the wireless communication apparatus 1 according to the present embodiment is arranged so that: the control section 41 gives an instruction so that a lower power source voltage is selected when a smaller transmission power should be set, so as to change the power source voltage and the gain, thereby changing the transmission power without providing any switch on the transmission path. Thus, it is possible to prevent the loss of the signal transmission and it is possible to reduce the power consumption of the wireless module 14 compared with an arrangement in which a switch is provided on the transmission path.

Further, unlike the arrangement of the comparative example, it is possible to change the transmission power though any switch is not provided on the transmission path. Thus, it is possible to prevent the loss of the signal transmission and it is possible to reduce the power consumption of the wireless module 14 compared with an arrangement in which a switch is provided on the transmission path.

Figure 13:
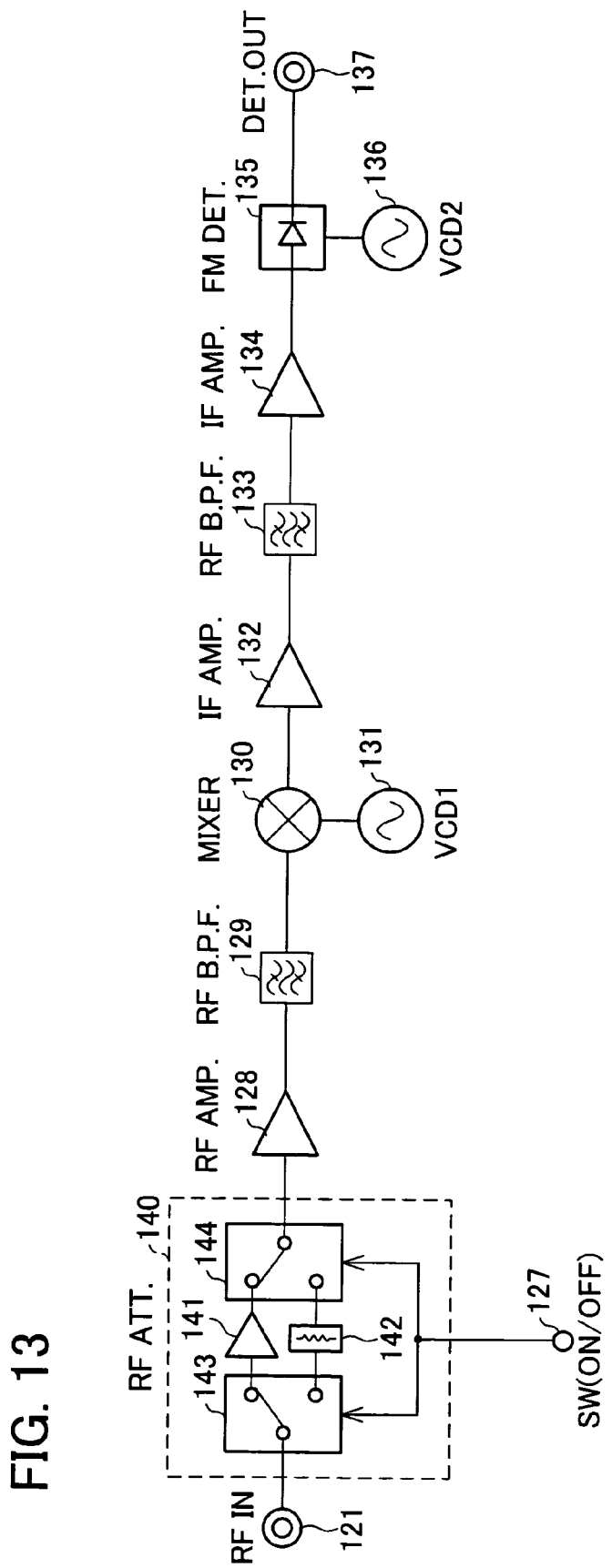
FIG. 13 is a block diagram showing a wireless module employing an RFAGC circuit as an example of conventional art.

Further, like switches 143 and 144 shown in FIG. 13, it is necessary to provide switches, consuming relatively large power, each of which occupies a large area, as the switches provided on the signal transmission paths, in order to transmit signals. However, the switch 42 shown in FIG. 1 is provided on a power source voltage supplying path, so that it is possible to realize the switch, arranged in a simpler manner, which consumes less power than a switch on a signal path. Thus, it is possible to simplify an arrangement of the wireless module 14.

Further, the power source voltages V1 and V2 are voltages required in circuits (signal sources) for generating a high frequency signal inputted to the power amplifier 10 of the wireless module 14, that is, voltages required in the conversion processing section 8, the IQ modulation/demodulation processing section 6, and the baseband signal processing circuit section 4. Thus, the switch 42 can supply the power source voltages V1 and V2 to the power amplifier 10 merely by selecting connection between (a) power source lines L1 and L2 to which the power source voltages V1 and V2 are applied and (b) the power source terminal of the power amplifier 10. Therefore, it is not necessary to newly provide a circuit for generating the power source voltages V1 and V2, so that it is possible to reduce the circuit size of the wireless module 14.

In addition, as shown in FIG. 5 for example, the power consumption of the power amplifier 10 is determined in accordance with output power. As more power is outputted, more currents are consumed. Further, as shown in FIG. 6, when the power source voltage drops, a maximum power which can be outputted drops. However, it is general that: no matter which power source voltage may be used out of power source voltages different from each other, there is substantially no change in the power consumption regardless of the power source voltage as long as it is possible to output certain power. In an example of FIG. 5, the power consumption tends to slightly decrease when the power source voltage drops. Further, the power consumption of the power amplifier 10 is basically calculated as follows: current×power source voltage.

Thus, in case where the transmission power that should be set is lower, the switch 42 selects a lower power source voltage within such a range that it is possible to transmit the transmission power, so that it is possible to largely reduce the power consumption of the power amplifier 10.

The following description gives an example of an arrangement of the wireless communication apparatus 1. The wireless communication apparatus 1 is arranged so that it is possible to switch between (a) a mode (normal communication mode) in which the transmission power from the antenna A is set to be 16 [dBm] when the transmission power is not particularly limited and (b) a mode (less power consumption communication mode) in which the transmission power from the antenna A is set to be 0 [dBm] supposing that communications are performed in a room for example. In case of such arrangement, when the output power of the conversion processing section 8 is 0 [dBm] and a loss from the power amplifier 10 to the antenna A is 4 [dBm], it is necessary to set the outputs of the power amplifier 10 to be 20 [dBm] and 4 [dBm]. Thus, in case of the power amplifier 10 having properties shown in FIG. 4 to FIG. 6, it is necessary to supply a voltage of 3 [V] or higher as a power source voltage during a period in which an output of 20 [dBm] is required. Note that, [dBm] is power based on 1 [mW], and is calculated as follows (power is indicated by Pout): 10·log(Pout [mW]/1 [mW]).

In this case, as shown in FIG. 7, the current consumption is 89 [mA]. Thus, when power required in controlling the power amplifier 10 is 10 [mW], the power consumption of the power amplifier 10 is as follows: 89 [mA]×3.0 [V]+10 [mA]=277 [mW]. Note that, in case of the normal communication mode, the switch 42 according to the present embodiment selects the power source voltage V1 of 3.0 [V] out of the power source voltages V1 to V3 that are shown in FIG. 1, and supplies thus selected power source voltage V1 to the power amplifier 10.

Incidentally, when a gain of the power amplifier 10 is controlled without changing the power source voltage from the power source voltage of other comparative example so that the output of the power amplifier 10 is 4 [dBm], the current consumption in this case is 35 [mA] as shown in FIG. 6. As a result, the power consumption is as follows: 35 [mA]× 3.0 [V]+10 [mW]=115 [mW].

On the other hand, in the wireless communication apparatus 1 according to the present embodiment, the switch 42 selects a lower power source voltage within such a range that desired transmission power can be transmitted. Specifically, the output of the power amplifier 10 is required to be 4 [dBm], so that mere 1.0 [V] is required as the power source voltage of the power amplifier 10 as shown in FIG. 5 to FIG. 7. In case of the less power communication mode, the switch 42 selects the power source voltage V2 of 1.5 [V] out of the power source voltages V1 to V3 shown in FIG. 1, and supplies thus selected power source voltage V2 to the power amplifier 10.

In case of the power amplifier 10 having properties shown in FIG. 4 to FIG. 6, the current consumption in this case is 32.5 [mA], so that the power consumption is as follows: 32.5 [mA]×1.5 [V]+10 [mW] is substantially equal to 59 [mW]. As a result, it is possible to reduce the power consumption by 56 [mW] compared with an arrangement in which the output is reduced merely by controlling the gain like the comparative example, and it is possible to suppress the power consumption at approximately ½ compared with the comparative example.

Note that, the foregoing description explained the case where the power source voltage V2 supplied to the wireless module 14 is 1.5 [V]. In case of the power source voltage V2 supplied to the wireless module 14 is 1.0 [V], the current consumption is 32 [mA] as shown in FIG. 5. Thus, the power consumption is as follows: 32 [mA]×1.0 [V]+10 [mW]=42 [mW]. As a result, it is possible to reduce the power consumption compared with the power consumption of the comparative example, and it is possible to suppress the power consumption at ⅓ of the comparative example.

Further, in the foregoing arrangement, a gain in case where the power amplifier 10 amplifies a high frequency signal from the conversion processing section 8 is changed by changing the power source voltage supplied to the power amplifier 10. Thus, unlike an arrangement in which a switch is provided on a transmission path and ON/OFF of the power amplifier is switched by the switch, that is, unlike an arrangement in which the power amplifier is not provided on a transmission path to which the transmission is switched, it is possible to amplify the signal to such an extent that the output power of the power amplifier 10 can be normally communicated even in case where the output power of the conversion processing section 8 is so low that it is impossible to normally perform communications when the output power is outputted to the antenna A without any modification. Thus, when selecting an RF circuit such as the conversion processing section 8 and the IQ modulation/demodulation processing section 6, it is possible to more freely perform the selection than in the case of selecting such an RF circuit that a level of the output power of the conversion processing section 8 is the same as or higher than a desired level. Note that, when the gain is adjusted without changing the power source voltage of the power amplifier 10, it is difficult to reduce the power consumption as described above. However, in the present embodiment, the switch 42 changes the power source voltage, so that it is possible to largely reduce the power consumption.

Generally, a ratio of the power consumption of the power amplifier 10 with respect to the power consumption of the whole wireless communication apparatus 1 is relatively large. For example, in a wireless LAN card (wireless communication apparatus) which is in compliance with a current IEEE802.11b standard, a ratio of the power consumption of the power amplifier with respect to the power consumption of the whole card is approximately 1:3. Thus, reduction of the power consumption of the power amplifier 10 enables the power consumption of the whole wireless communication apparatus 1 to be largely reduced.

Further, the wireless communication apparatus 1 may be a stationary wireless communication apparatus. However, a mobile wireless communication apparatus is driven by a battery or the like, and reduction of the power consumption results in extension of utilization, so that such mobile wireless communication apparatus is particularly preferable. Further, the wireless communication apparatus 1 according to the present embodiment can change the transmission power in accordance with conditions, and the wireless communication apparatus 1 which can reduce the power consumption can be particularly favorably used in case where a distance to a communication end varies like a case where the communication end or the user himself/herself uses a mobile wireless communication apparatus.

Incidentally, the foregoing description explained an arrangement in which the normal communication mode and the less power consumption communication mode are switched from each other. However, the wireless communication apparatus 1 according to the present embodiment is arranged so that it is possible to switch the normal communication mode to a concealed communication mode in which the transmission power is further limited than the less power consumption communication mode.

In more detail, the concealed communication mode is a mode in which: a communication range is limited to a case where the wireless communication apparatus 1 is in contact with the communication end or a range in which the user is positioned so near to the communication end that the user can see the communication end (for example, within 4 [m], or a similar range), thereby preventing a third person from intercepting communications. Transmission power of the wireless communication apparatus 1 in the concealed communication mode can be limited to such an extent that it is possible to prevent the third person from intercepting communications, and power which allows the user to communicate with the communication end within the communication range is required. For example, in order to prevent the third person from intercepting communications, transmission power of −10 [dBm] or less is favorably used. Further, in order to surely communicate with a regular communication end which is not in contact with the wireless communication apparatus 1, transmission power of −50 [dBm] or more is favorably used.

While, in case where an antenna of the user apparatus and an antenna of a communication end apparatus are in contact with each other, generally, it is possible to substantially surely perform communications as long as the transmission power corresponds to the communication end's receiving sensitivity (minimum receivable power)+10 [dB]. Further, when the transmission power corresponds to the communication end's receiving sensitivity (minimum receivable power)+20 [dB], it is possible to perform communications more stably. Under the current situation, it is often that the communication end's receiving sensitivity is set to be −80 [dBm], so that the transmission power of −70 [dBm] or more for example is favorably used in case where the communication end and the wireless communication apparatus 1 are in contact with each other.

Further, in case where the contact communication is exclusively performed, an upper limit is set to be the receiving sensitivity (minimum receivable power)+approximately 20 [dB], so that it is possible to more surely prevent the third person from intercepting communications. Thus, in the case where the contact communication is exclusively performed, the transmission power is set to be in a range of +10 to 20 [dBm] on the basis of the receiving sensitivity (minimum receivable power), so that it is possible to perform communications safely and surely.

In the present embodiment, the transmission power of the wireless communication apparatus 1 is limited to −20 [dBm], out of these ranges, as a particularly preferable value. Specifically, the switch 42 according to the present embodiment is arranged so that the switch 42 can select not only the aforementioned power source voltages V1 and V2 but also the power source voltage V3 of 0 [V], and the control section 41 gives the switch 42 an instruction to select the power source voltage V3 in case where the concealed communication mode is set, for example, in case where the user gives an instruction to switch the mode to the concealed communication mode. Further, the control section 41 instructs the ACG control section 22 so as to perform the ACG control so that the output power of the power amplifier 10 is −16 [dBm].

Thus, in case of the power amplifier 10 having properties shown in FIG. 4 to FIG. 6, the output power is −16 [dBm], and the transmission power from the antenna A is limited to −20 [dBm]. As a result, the communication range of the wireless communication apparatus 1 is limited to an extremely narrow range, such as the case where the wireless communication apparatus 1 and the communication end are in contact with each other, the case where an antenna of the user apparatus and an antenna of the communication end apparatus are in contact with each other, or a range in which the wireless communication apparatus 1 and the communication end are positioned within 4 [m], so that it is possible to prevent the third person from intercepting communications.

Note that, also in this case, not the switch provided on the signal path but the switch selecting an existing voltage controls the gain as in the selection of the power source voltages V1 and V2, so that it is possible to simplify a circuit arrangement of the wireless communication apparatus 1.

Further, in the case of the concealed communication mode, the control section 41 according to the present embodiment controls the power amplifier 10 and controls a circuit for supplying power, which causes the power amplifier 10 to be controlled, to the power amplifier 10, so as to stop controlling the power amplifier 10.

In case where only the gain control causes the output to drop to −10 [dBm] or less (for example, −20 [dBm] or the like) like the comparative example, the current consumption is 27 [mA], so that the power consumption is as follows: 27 [mA]×3 [V]+10 [mW]=91 [mW].

On the other hand, the power consumption of the power amplifier 10 of the present embodiment is 0 as shown in a bottom line of FIG. 7, so that it is possible to largely reduce the power consumption of the wireless communication apparatus 1. Note that, the foregoing description explained the case where the control of the power amplifier 10 is stopped as an example. However, as shown in the second line from the bottom of FIG. 7, also in case where the control is not stopped, the power consumption is 10 [mW], and the power consumption is largely reduced compared with the comparative example.

Note that, the foregoing description explained the case where the ACG control is performed so as to set the transmission power to be −20 [dBm] as an example. However, it may be so arranged that: the control section 41 gives the ACG control section 22 an instruction to stop the ACG control in case where it is possible to set the transmission power to be a desired value even when the ACG control is stopped and open control is performed, for example, in case of setting the transmission power to be −14 [dBm] or in a similar case.

Incidentally, the foregoing description explained the case where: in the wireless module 14, the power source circuit 12 of the wireless communication apparatus 1 generates the power source voltages V1 to V3 that are required in the circuits (4•6•8) for generating a high frequency signal supplied to the power amplifier 10, so as to supply the power source voltages V1 to V3 via the power source terminals T1 to T3 of the wireless module 14. However, the arrangement is not limited to this.

Figure 8:
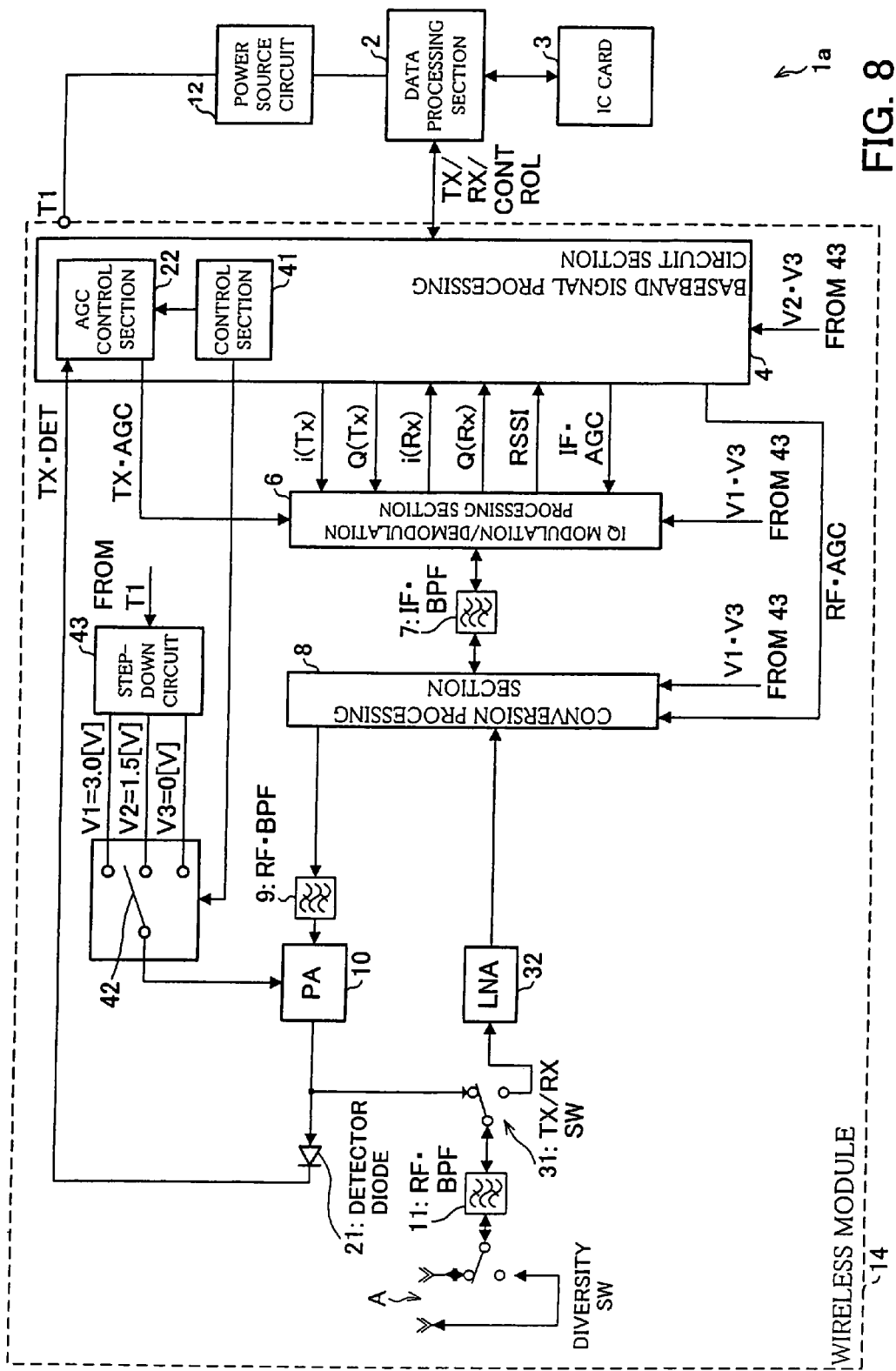
FIG. 8 is a block diagram showing a modification example of the wireless communication apparatus.

For example, as shown in FIG. 8, it may be so arranged that: a step-down circuit 43 is provided in a wireless module 14a arranged substantially in the same manner as the wireless module 14 so that the step-down circuit 43 generates the power source voltages V1 to V3. Note that, in this case, the power source circuit 12 supplies the power source voltage to the wireless module 14a via the power source terminal T1, and the step-down circuit 43 generates the power source voltages V1 to V3, that are required in the circuits 4•6•8, in accordance with the power source voltage from the power source terminal T1. Even in this case, the power source voltages V1 to V3 are required in the circuits 4•6•8, so that it is possible to simplify an arrangement of the wireless communication apparatus 1a and it is possible to reduce the power consumption as in the wireless communication apparatus 1 of FIG. 1.

Embodiment 2

The Embodiment 1 explained the example where a gain with respect to a high frequency signal is controlled only by the power amplifier 10. The present embodiment will explain an arrangement in which the transmission power of the wireless communication apparatus is controlled by controlling not only the gain of the power amplifier 10 but also a gain of the preceding stage amplifier for amplifying the high frequency signal in the conversion processing section.

Figure 9:
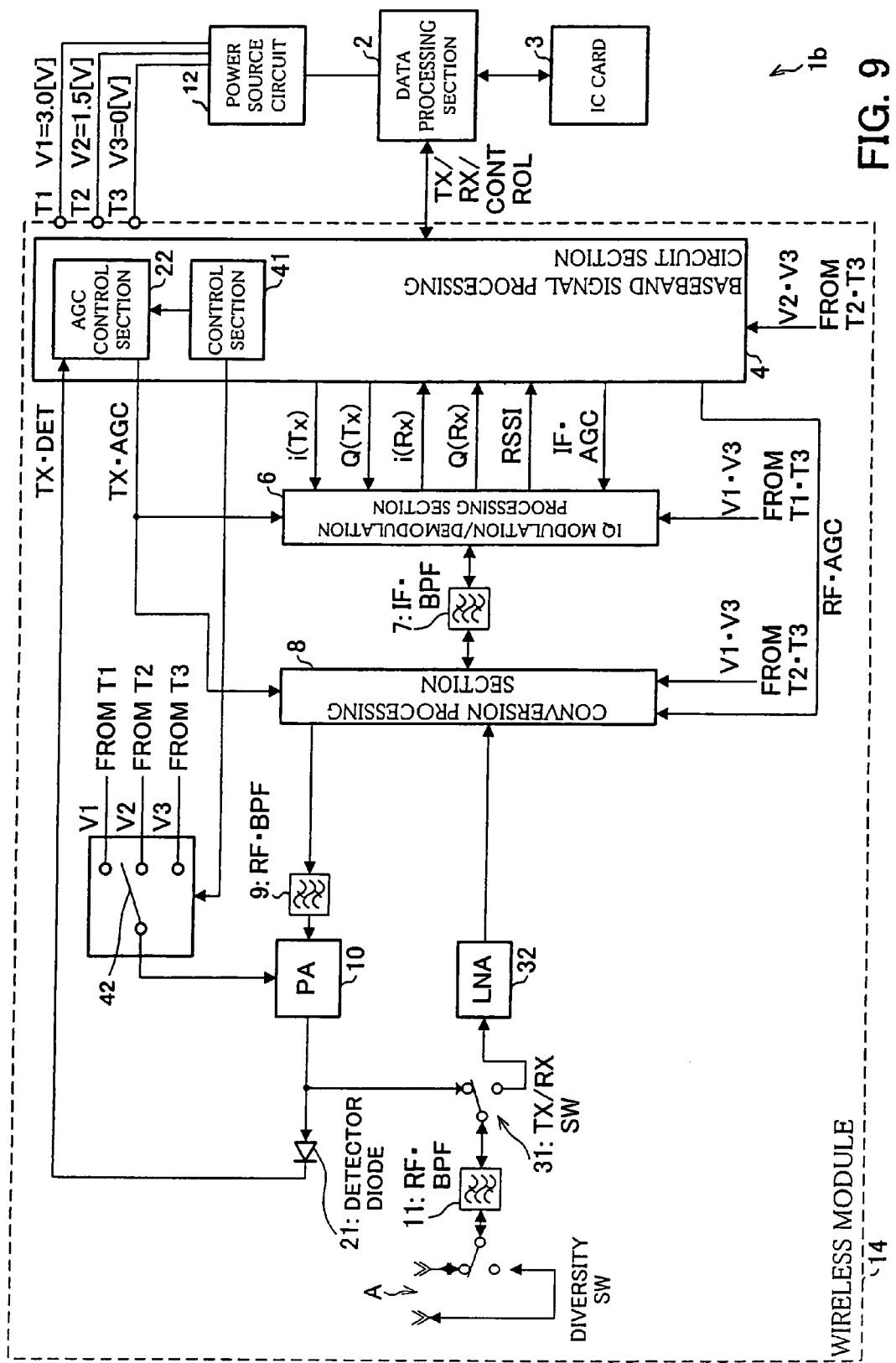
FIG. 9 is a block diagram showing an arrangement of important portions of a wireless communication apparatus as another embodiment of the present invention.

That is, a wireless communication apparatus 1b according to the present embodiment is arranged so that the AGC control section 22 controls a gain of a conversion processing section 8b using the control signal TX•AGC, as shown in FIG. 9. Note that, the baseband signal processing circuit section 4 may indicate respective gains to the IQ modulation/demodulation processing section 6 and the preceding stage amplifier 81 by using the same control signal TX•AGC or by respectively using different control signals TX•AGC.

Figure 10:
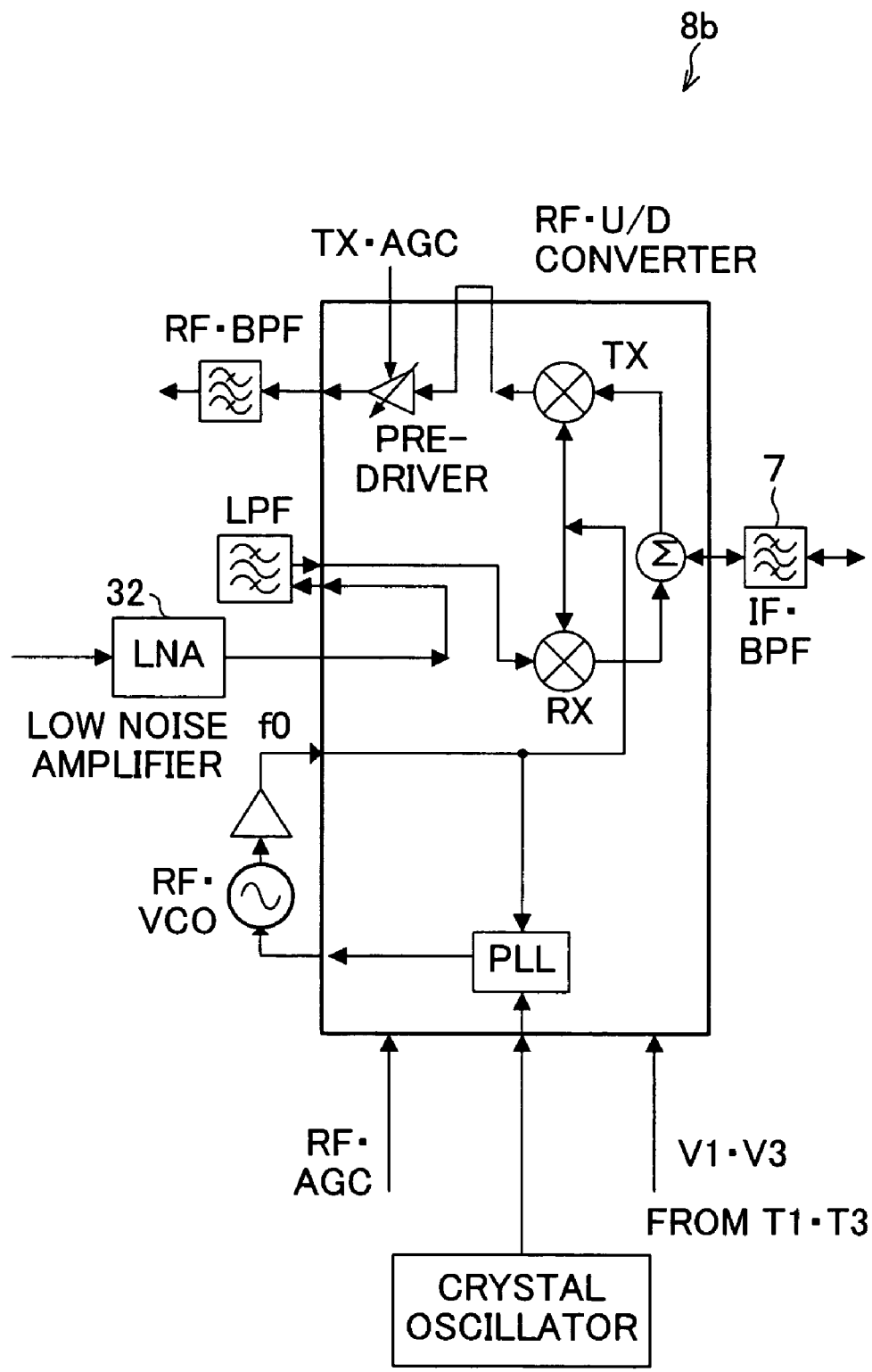
FIG. 10 is a circuit diagram showing an arrangement of important portions of a conversion processing section provided in the wireless communication apparatus.

Further, as shown in FIG. 10, the conversion processing section 8b, which is provided in the present embodiment in replacement of the conversion processing section 8, is arranged substantially in the same manner as in the conversion procession section 8 shown in FIG. 2. However, the conversion processing section 8b is provided with a preceding stage amplifier 81b whose gain is variable, as the preceding stage amplifier for amplifying a high frequency signal.

Unlike the Embodiment 1, the foregoing arrangement controls a gain with respect to a high frequency signal not only by the power amplifier 10 but also by the preceding stage amplifier 81b for amplifying the high frequency signal. There are cases where the power amplifier 10 cannot sufficiently amplify a high frequency signal and cannot output sufficient power, even if one of power source voltages of the circuits (4, 6, 8) for generating a high frequency signal in a wireless module 14b is selected by the switch 42 and is supplied to the power amplifier 10. In such cases, it is possible to set the output power of the power amplifier 10 to a desired value by combining the gain control of the preceding stage amplifier 81b.

Also in this case, the power source voltage of the power amplifier 10 is changed in accordance with the transmission power to be transmitted. Therefore, as in the Embodiment 1, it is possible to remarkably reduce the power consumption of the power amplifier 10 without much complicating the arrangement of the wireless module 14b, compared with the arrangement in which the power source voltage of the power amplifier 10 is fixed.

Figure 11:
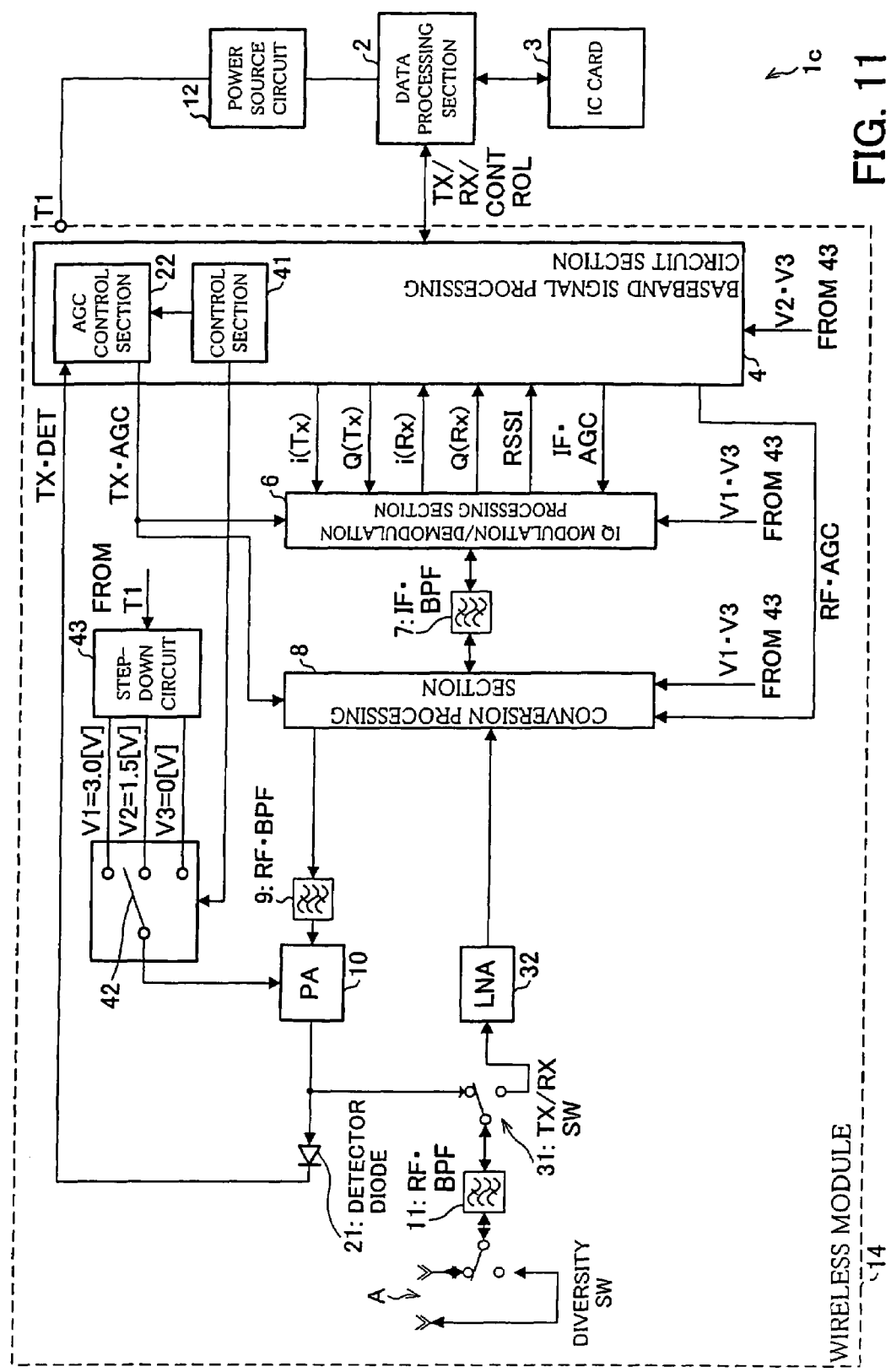
FIG. 11 is a block diagram showing a modification example of the wireless communication apparatus.
Figure 12:
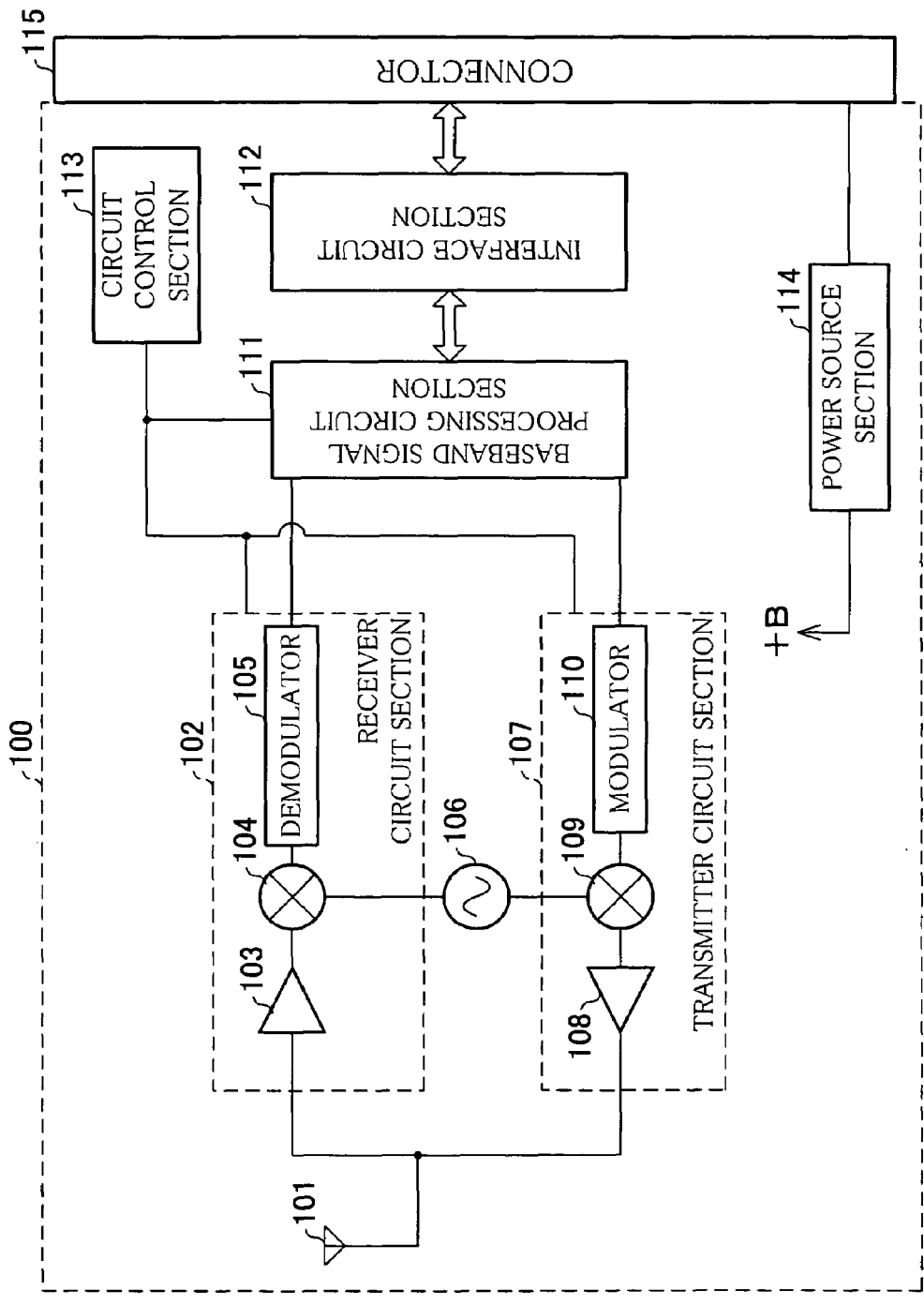
FIG. 12 is a block diagram showing an arrangement of important portions of a card type wireless communication apparatus as an example of conventional art.

Note that, FIG. 9 shows the example where one of the power source voltage terminals T1 through T3 in the wireless module 14 is selected by the switch 42 so as to connect to the power amplifier 10 as in FIG. 1. However, as in FIG. 8, a wireless module 14c may be provided with a step-down circuit 43 as shown in a wireless communication apparatus 1c of FIG. 11. Also in this case, since the power source voltages V1 to V3 that are selectable by the switch 42 are required in the circuits for generating a high frequency signal, it is possible to simplify the arrangement of the wireless communication apparatus 1c and reduce the power consumption, as in the wireless communication apparatus 1a shown in FIG. 8.

Further, the Embodiments 1 and 2 explained the examples where the power source voltages that are selectable by the switch 42 are the power source voltages (V1 to V3) of the members (4, 6, 8) of the wireless module 14. However, the power source voltages that are selectable by the switch 42 may be a power source voltage of a circuit electrically connected to the wireless module 14, including a member in the wireless communication apparatus 1 (such as the data processing section 2 and IC card 3). Also in this case, similar effect can be achieved since it is not necessary to provide a circuit for newly generating a power source voltage selectable by the switch 42.

Incidentally, in the foregoing embodiments, an intermediate frequency signal having an intermediate frequency is generated in the modulation and demodulation between the baseband signal and the high frequency signal, but the generation of the intermediate frequency signal is not necessarily required. The high frequency signal may be directly down-converted to the baseband signal or the baseband signal may be directly up-converted to the high frequency signal.

Note that, FIGS. 4 through 7 show the case where the characteristics of the power amplifier whose model numbers are IRM049U6 and IRM037U6 manufactured by Sharp Corporation are used as an example. However, among the characteristics of the power amplifier 10 as described above, "when the power source voltage drops, a maximum power which can be outputted becomes lower" and "the power consumption of the power amplifier 10 is basically calculated as current×power source voltage" are general tendencies of a power amplifier. Thus, even if a general power amplifier is used as the power amplifier 10, the power source voltage of the power amplifier 10 may be similarly changed in accordance with desired transmission power. Specifically, when transmission power is not much required for the transmission, it is possible to reduce the power consumption by lowering the power source voltage of the amplifier; and when large transmission power is required for the transmission, it is possible to transmit a wireless signal using the necessary transmission power by raising the power source voltage of the amplifier.

Further, like the power amplifier 10 as described above, a class "AB" power amplifier, which is generally used as the power amplifier 10 in a wireless communication circuit for wireless LAN, has such a tendency that "the current consumption is determined in accordance with output power, and more currents are consumed as more power is outputted". Thus, if the class "AB" power amplifier is used as the power amplifier 10, more significant effect can be achieved compared with the case where the amplifier such as a class-A amplifier, which consumes substantially the same amounts of currents irrespective of the output power, is used.

Further, even if a general amplifier does not have such a tendency that "as the power source voltage is lower, the gain decreases," the gain of the amplifier generally decreases when the power source voltage becomes below a certain constant value compared with a case where the power source voltage is not less than the certain value. Similarly, even if an amplifier does not have such a tendency that "as the power source voltage is lower, the current consumption decreases," the current consumption of the amplifier generally decreases when the power source voltage becomes below a certain constant value compared with a case where the power source voltage is not less than the certain value. Thus, even if a typical power amplifier is used as the power amplifier 10, substantially similar effect can be attained as in the foregoing embodiments. Further, especially significant effect can be attained if the power amplifier having both the tendencies as mentioned above is used as the power amplifier 10.

Further, the forgoing embodiments explained the examples where the gain of the power amplifier 10 is changed by changing the power source voltage, but the present invention is not limited to this. Even if the gain of the power amplifier 10 is constant irrespective of changes in the power source voltage, a maximum power which can be outputted becomes lower when the power source voltage drops, and the power consumption of the power amplifier 10 is basically calculated as current×power source voltage, as described above. Thus, in accordance with the power to be outputted from the power amplifier 10, the power source voltage of the power amplifier 10 should be changed by switching the switch 42. With this, when transmission power is not much required for the transmission, it is possible to reduce the power consumption by lowering the power source voltage of the amplifier; and when large transmission power is required for the transmission, it is possible to transmit a wireless signal using the necessary transmission power by raising the power source voltage of the amplifier.

Note that, the foregoing embodiments explained the cases where the levels of the constant voltages (power source voltages) generated by the power source circuit 12 are always constant and the switch 42 selectively supplies one of the constant voltages to the power amplifier 10, but the present invention is not limited to this. The power source circuit 12 may be a variable power source that varies a generating constant voltage according to conditions (time points). In this case, similar effect can be achieved provided that the voltage (power source voltage) is at constant level under a certain condition (at a certain time point). Further, in this arrangement, plural levels of constant voltages can be supplied via a power source line. Thus, the number of power source lines is reduced compared with the arrangement in which constant voltages that can be supplied to the power amplifier 10 are separately generated and respectively provided with different power source lines. Note that, the gain and maximum output may be also adjusted in accordance with the variable voltage.

As an example, there is a power source voltage whose level is varied within a certain range (from 1.0 V to 1.5 V, for example) according to a time point and condition (load of the CPU, for example), such as a voltage to be supplied to the CPU. Further, if the load is the CPU, the load may change the power source voltage. Such a power source voltage is also controlled to be at a certain level at a certain time point or under a certain condition by the power source circuit. Therefore, the power source circuit may be a variable power source, and the level of the power source voltage supplied from the power source circuit may be changed. For example, if three power sources that respectively generate 3.3[V] for an external interface and 1.0 to 1.5 [V] and 0 [V] for the CPU are prepared, the three voltages may be switched from one another. Here, if the gain is controlled so as not to cause the output to exceed the maximum possible output with respect to each voltage, it is possible to perform the communication while consuming small amounts of power corresponding to the communication mode.

In either case, similar effect can be attained if there is provided means for (i) supplying to the power amplifier 10 the same voltage as the voltage supplied to at least one of the circuits, other than the amplifier, either contained in the wireless communication circuit or electrically connected to the wireless communication circuit and (ii) changing the power source voltage supplied to the power amplifier 10 in accordance with the power to be outputted from the power amplifier 10.

As described above, the wireless communication circuit (wireless modules 14 to 14c) according to the present invention, provided with an amplifier (power amplifier 10) for amplifying an inputted signal so as to output thus amplified signal to an antenna (A), includes: a switch (42) for selecting a constant voltage from predetermined plural constant voltages supplied to at least one of circuits, other than the amplifier, either contained in the wireless communication circuit or electrically connected to the wireless communication circuit, so as to supply thus selected constant voltage; and control means (control section 41) for switching the switch in accordance with a power which should be outputted by the amplifier.

Note that, any circuit is used as the circuits other than the amplifier as long as the circuit is included in the wireless communication circuit or is electrically connected to the wireless communication circuit (for example, the circuit is included in the wireless communication apparatus having the wireless communication circuit). An example of the circuit other than the amplifier is a circuit (signal source) used to generate a signal supplied to the amplifier. Examples of the circuit (signal sources: data processing section 2, IC card 3, baseband signal processing circuit section 4, IQ modulation/demodulation section 6, conversion processing section 8, and the like) used to generate a signal supplied to the amplifier include: a data processing circuit for generating data that should be sent; a storage device which stores data referred to by the data processing circuit in generating the data that should be sent; and a modulation circuit for modulating the data that should be sent. Further, the circuit other than the amplifier may be an interface circuit with respect to a host computer, a memory circuit that is not used to generate the signal supplied to the amplifier, or sound/video data processing circuit for example, as long as the circuit is included in the wireless communication circuit or is electrically connected to the wireless communication circuit.

In the foregoing arrangement, the control means causes the switch to select any one of the constant voltages in accordance with a power that should be outputted by the amplifier and to supply thus selected constant voltage to the amplifier, and the amplifier uses the constant voltage as a power source voltage and amplifies an inputted signal (e.g., a signal or the like from the signal source) so as to output thus amplified signal to the antenna.

As a result, it is possible to change transmission power of a radio signal outputted from the antenna. Thus, in case where it is possible to perform communications even when the transmission power is not so high, for example, in case where a communication end is positioned relatively near to a wireless communication circuit, it is possible to reduce power consumption by dropping the power source voltage of the amplifier. While, in case where it is impossible to perform communications unless the transmission power is so high, for example, in case where the communication end is positioned relatively far from the wireless communication circuit, it is possible to transmit the radio signal with necessary communication power by raising the power source voltage of the amplifier.

Generally, the power consumption of the amplifier of the wireless communication apparatus is basically as follows: power consumption×power source voltage. The communication power which can be outputted by the amplifier drops as the power source voltage becomes lower. Thus, according to an arrangement in which the transmission power is fixed, when the power source voltage of the amplifier is set to be high for fear that it is impossible to perform communications unless the transmission power is so high, power consumed in case where great transmission power is not required is increased. While, according to an arrangement in which the transmission power is fixed, when the power source voltage is set to be suitable for the case where great transmission power is not required, it is impossible to make the transmission power so high, so that it is impossible to perform communications with a communication end positioned far from the wireless communication circuit.

On the other hand, according to the foregoing arrangement, the transmission power is changed as required, and the power source voltage of the amplifier is changed, so that it is possible to largely reduce the power consumption of the wireless communication circuit, without narrowing the communication range, compared with an arrangement in which the transmission power is uniformed and an arrangement in which the power source voltage of the amplifier is fixed.

Further, the constant voltage selected by the switch is a constant voltage supplied to the signal source, so that it is not necessary to newly provide a voltage generating circuit as long as a system including the signal source is used. This is because the voltage generating circuit exists in the system in order to operate the signal source. Thus, it is possible to reduce the circuit size and the power consumption compared with the case where the voltage generating circuit is provided.

As a result, it is possible to realize the wireless communication circuit which occupies a small area and consumes small amounts of power without narrowing the communication range.

Further, in addition to the foregoing arrangement, it may be so arranged that: the control means controls the switch so as to select a constant voltage, enabling the power which should be outputted by the amplifier to be outputted, which is as low as possible, out of the constant voltages.

The control means causes the switch to select a constant voltage, enabling power that should be outputted by the amplifier to be outputted, out of the constant voltages, and the control means controls the switch so that a constant voltage selected at a certain time is lower than a constant voltage selected at other time, so that it is possible to reduce the power consumption of the wireless communication circuit. However, the switch is controlled so as to select a constant voltage which is as low as possible, thereby further reducing the power consumption.

Further, in addition to the foregoing arrangement, it may be so arranged that: in case where each of the constant voltages is supplied as a power source voltage, a gain of the amplifier is set to be a predetermined gain so as to correspond to the constant voltage that has been supplied, and the control means causes the switch to select a constant voltage from the constant voltages so as to control the gain of the amplifier.

According to the arrangement, the switch changes the power source voltage supplied to the amplifier so as to change the gain of the amplifier, thereby changing the transmission power. Thus, it is possible to change the transmission power without providing a switch on a signal path in which a signal is outputted from the signal source via the amplifier to the antenna.

In case where a plurality of signal paths different from each other in terms of a gain are provided and a switch selects a signal path via which a signal is outputted to the antenna, the signal is transmitted via the switch, so that it is necessary to use a switch whose operation speed is so high that it is possible to transmit the signal without any trouble. As a result, the power consumption and the loss of the switch tend to increase, and an area occupied by integrated switches tends to increase.

On the other hand, according to the foregoing arrangement, the switch merely selects a constant voltage supplied to the amplifier, so that it is sufficient to use switches which consume less power and occupy a smaller area in case of integration than the arrangement in which a switch for transmitting a signal is provided. Further, unlike the arrangement in which a switch for transmitting a signal is provided, a switch for changing a gain is provided on a power source voltage supplying path, so that signal loss caused by the switch does not occur. Thus, it is possible to realize the wireless communication circuit which occupies a smaller area and consumes small amounts of power without narrowing the communication range. Note that, the power source voltage of the amplifier is changed so as to control the gain of the amplifier, so that it is possible to largely reduce the power consumption of the amplifier compared with the arrangement in which the power source voltage of the amplifier is fixed.

Further, in addition to the foregoing arrangement, it may be so arranged that: the power which should be outputted includes an output power, predetermined as a communication power for a concealed communication, which enables transmission as a lower communication power than in a normal communication. The communication power for the concealed communication may be set to be a value which allows a communication with a device positioned within a distance of 4 [m] for example. A communication power X [dBm] defined as the communication power for the concealed communication may be set to be −10 [dBm] or less when a communication power is Pout, on the basis of expression with [mW], and X [dBm]=10·log(Pout [mW]/1 [mW]). Further, the communication power for the concealed communication may be set to be a value which allows a communication with an apparatus in contact with an apparatus having the wireless communication circuit (for example, the wireless communication apparatus having the wireless communication circuit), or may be set to be in a range of from +10 [dB] to 20 [dB] in accordance with a lowest receivable power of a communication end.

According to the foregoing arrangement, the wireless communication circuit transmits a signal from the antenna with a communication power, predetermined as the communication power for the concealed communication, which is lower than in a normal communication power. Thus, it is possible to further limit a communication range compared with the case where communications are performed with a normal transmission power, and it is possible to reduce a possibility that communications with a regular communication end may be received, so that it is possible to perform communications more safely.

The communication power for the concealed communication is lower than the normal communication power. Thus, in case of limiting the communication power merely by performing the gain control of the amplifier with the power source voltage fixed, it is difficult to reduce the power consumption of the amplifier even though the communication power for the concealed communication is low. However, according to the foregoing arrangement, the control means causes the switch to change the power source voltage of the amplifier, so that it is possible to reduce the power consumption compared with the case where the power source voltage is fixed. As a result, it is possible to perform the concealed communication with much lower power consumption than that in the normal communication.

Note that, even in this case, the power source voltage of the amplifier is controlled in accordance with which constant voltage the switch supplies to the amplifier. Generally, the number of levels of the constant voltage required in the wireless communication circuit or a circuit electrically connected to the wireless communication circuit is more than 2. Thus, merely by increasing the number of power source lines (power source terminals T1 to T3) that the switch can select, it is possible to supply the constant voltage, selected in the concealed communication, to the amplifier without any trouble.

Further, in addition to the foregoing arrangement, the wireless communication circuit may be arranged so as to include: a modulation circuit (conversion processing circuit 8) for modulating an inputted signal so as to output thus modulated signal to the amplifier; and a modulation gain adjustment circuit (AGC control section 22•control section 41) for changing a gain of the modulation circuit in association with switching of the switch. Further, in addition to the foregoing arrangement, the wireless communication circuit may include: a modulation circuit (conversion processing circuit 8) for modulating an input signal so as to output thus modulated signal to the amplifier; and a modulation gain adjustment circuit (AGC control section 22•control section 41) for changing a gain of the modulation circuit in accordance with a detection result of an output power of the amplifier and for changing a process of controlling the gain of the modulation circuit in association with switching of the switch so as not to saturate the amplifier.

With these arrangements, the gain of the modulation gain adjustment circuit is adjusted in association with the switch. Thus, it is possible to set the total gain of the modulation circuit and the amplifier to a desired gain, thereby setting the transmission power of the wireless communication circuit to a desired value. Further, in an arrangement where the power source voltage of the amplifier is used to control the gain of the amplifier, there are cases where a voltage required in obtaining a desired gain differs from a voltage supplied to a signal source, or the gain is not sufficiently changed merely by changing the power source voltage. In such cases, since the gain of the modulation gain adjustment circuit is adjusted in association with the switch, it is possible to set the total gain of the modulation circuit and the amplifier to a desired gain. Note that, irrespective of whether or not the gain of the amplifier is controlled, the power source voltage of the amplifier is changed in accordance with the power to be outputted. Therefore, it is possible to remarkably reduce the power consumption compared with an arrangement in which the power source voltage of the amplifier is fixed.

Further, in addition to the foregoing arrangement, the wireless communication circuit may be arranged so as to include a power source (power source circuit 12) for supplying the constant voltages, wherein at least one level of the constant voltages supplied by the power source is changeable. Also in this case, the effect as described above can be similarly achieved if the voltage is at constant level under a certain condition (at a certain time point).

Incidentally, the wireless communication circuit can be used in a stationary wireless communication apparatus, but is suitably used in a mobile wireless communication apparatus, in particular. Specifically, the wireless communication apparatus (1 to 1c) according to the present invention, which is a mobile type, is arranged so as to include any one of the foregoing wireless communication circuits. Here, a mobile wireless communication apparatus when used in mobile form is not powered from the outside, but powered by an internal power supply source (such as a battery). Accordingly, as the power consumption becomes large, the operation time becomes short. Here, the wireless communication circuit of the present invention can reduce its occupying area and power consumption without narrowing the communication range. Therefore it is possible to realize a smaller mobile wireless communication apparatus that can operate for a longer time.

INDUSTRIAL APPLICABILITY

According to the present invention, it is possible to realize a wireless communication circuit which occupies a small area and consumes small amounts of power without narrowing a communication range. Thus, it is possible to favorably use the wireless communication circuit as various wireless communication circuits including a card type wireless communication apparatus which is connected to (i) a mobile device such as a personal computer, PDA, or a mobile phone, (ii) an information terminal device such as an ADSL modem, a wireless access-point, or a wireless router, or (iii) household audio visual equipment such as a TV or DVD player, for example, and which has a wireless communication function based on wireless communication technology in compliance with the IEEE802.11 standards or spread spectrum technology such as Bluetooth, for example.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A wireless communication circuit, provided with an amplifier for amplifying an inputted signal so as to output thus amplified signal to an antenna, said wireless communication circuit comprising:
   a switch configured to be supplied predetermined plural constant voltages and to select one of the predetermined plural constant voltages as a constant voltage supplied to the amplifier, the predetermined plural constant voltages also being supplied to at least one of a plurality of circuits, other than the amplifier, either contained in the wireless communication circuit or electrically connected to the wireless communication circuit;
   control means for controlling the switch to select said one of the predetermined plural voltages as the constant voltage supplied to the amplifier in accordance with a power which should be outputted by the amplifier; and
   a detector to detect an output of the amplifier; and
   a controller to adjust transmission power of the antenna to be constant in response to the detected output of the amplifier, wherein
   the constant voltages of the predetermined plural constant voltages are different from one another.

2. The wireless communication circuit as set forth in claim 1, wherein the control means controls the switch so as to select a constant voltage, enabling the power which should be outputted by the amplifier to be outputted, which is as low as possible, out of the plural constant voltages.

3. The wireless communication circuit as set forth in claim 1, wherein:
   in case where each of the constant voltages is supplied as a power source voltage, a gain of the amplifier is set to be a predetermined gain so as to correspond to the constant voltage that has been supplied, and
   the control means causes the switch to select a constant voltage from the constant voltages so as to control the gain of the amplifier.

4. The wireless communication circuit as set forth in claim 1, wherein the power which should be outputted includes an output power, predetermined as a communication power for a concealed communication, which enables transmission as a lower communication power than in a normal communication.

5. The wireless communication circuit as set forth in claim 4, wherein the communication power for the concealed communication is set to be a value which allows a communication with a device positioned within a distance of 4 [m] of the wireless communication circuit.

6. The wireless communication circuit as set forth in claim 4, wherein a communication power X [dBm] defined as the communication power for the concealed communication may be set to be −10 [dBm] or less when a communication power is Pout, on the basis of expression with [mW], and X [dBm] =10·log(Pout [mW]/1 [mW]).

7. The wireless communication circuit as set forth in claim 4, wherein the communication power for the concealed communication may be set to be a value which allows a communication with an apparatus in contact with an apparatus having the wireless communication circuit.

8. The wireless communication circuit as set forth in claim 4, wherein the concealed communication power is set to be in a range of from +10 [dB] to 20 [dB] in accordance with a lowest receivable power of a communication end.

9. The wireless communication circuit as set forth in claim 1, comprising:
   a modulation circuit for modulating an inputted signal so as to output thus modulated signal to the amplifier; and
   a modulation gain adjustment circuit for changing a gain of the modulation circuit in association with switching of the switch.

10. The wireless communication circuit as set forth in claim 1, comprising:
    a modulation circuit for modulating an input signal so as to output thus modulated signal to the amplifier; and
    a modulation gain adjustment circuit for changing a gain of the modulation circuit in accordance with a detection result of an output power of the amplifier and for changing a process of controlling the gain of the modulation circuit in association with switching of the switch so as not to saturate the amplifier.

11. The wireless communication circuit as set forth in claim 1, comprising a power source for supplying the constant voltages, wherein at least one level of the constant voltages supplied by the power source is changeable.

12. A wireless communication apparatus, comprising a wireless communication circuit, provided with an amplifier for amplifying an inputted signal so as to output thus amplified signal to an antenna, said wireless communication circuit including:
    a switch configured to be supplied predetermined plural constant voltages and to select one of the predetermined plural constant voltages as a constant voltage supplied to the amplifier, the predetermined plural constant voltages also being supplied to at least one of a plurality of circuits, other than the amplifier, either contained in the wireless communication circuit or electrically connected to the wireless communication circuit;
    control means for controlling the switch to select said one of the predetermined plural voltages as the constant voltage supplied to the amplifier in accordance with a power which should be outputted by the amplifier;
    a detector to detect an output of the amplifier; and
    a controller to adjust transmission power of the antenna to be constant in response to the detected output of the amplifier, wherein
    said wireless communication apparatus is mobile, and
    the constant voltages of the predetermined plural constant voltages are different from one another.

* * * * *

UNITED STATES PATENT AND TRADEMARK OFFICE
CERTIFICATE OF CORRECTION

PATENT NO. : 7,623,896 B2
APPLICATION NO. : 10/945955
DATED : November 24, 2009
INVENTOR(S) : Tanaka et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 414 days.

Signed and Sealed this

Twenty-sixth Day of October, 2010

David J. Kappos
*Director of the United States Patent and Trademark Office*